(12) United States Patent
Hwang et al.

(10) Patent No.: US 8,080,938 B2
(45) Date of Patent: Dec. 20, 2011

(54) ORGANIC LIGHT EMITTING DISPLAY DEVICE AND METHOD FOR MANUFACTURING THE SAME

(75) Inventors: Young-In Hwang, Yongin-si (KR); Baek-Woon Lee, Yongin-si (KR); Hae-Yeon Lee, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 12/362,056

(22) Filed: Jan. 29, 2009

(65) Prior Publication Data

US 2010/0072882 A1 Mar. 25, 2010

(30) Foreign Application Priority Data

Sep. 19, 2008 (KR) ........................ 10-2008-0092134

(51) Int. Cl.
*H01L 51/50* (2006.01)
(52) U.S. Cl. .................... 313/506; 313/504; 313/509
(58) Field of Classification Search .......... 313/498–512; 257/E21.002; 438/35, 26–29, 34, 82; 428/690–691, 428/917; 427/66, 532–535, 539; 315/169.1, 315/169.3

See application file for complete search history.

(56) References Cited

U.S. PATENT DOCUMENTS

| | | | |
|---|---|---|---|
| 6,737,800 B1* | 5/2004 | Winters et al. | 313/504 |
| 2001/0019244 A1* | 9/2001 | Yamazaki et al. | 313/506 |
| 2006/0125388 A1* | 6/2006 | Song et al. | 313/506 |
| 2006/0186802 A1* | 8/2006 | Cok et al. | 313/506 |
| 2007/0290607 A1* | 12/2007 | Okada et al. | 313/504 |
| 2009/0102352 A1* | 4/2009 | Cok et al. | 313/498 |
| 2010/0141612 A1* | 6/2010 | Desieres et al. | 345/204 |

* cited by examiner

*Primary Examiner* — Toan Ton
*Assistant Examiner* — Fatima Farokhrooz
(74) *Attorney, Agent, or Firm* — H.C. Park & Associates, PLC

(57) ABSTRACT

The present invention relates to an organic light emitting display device and a manufacturing method thereof. The organic light emitting display device according to an exemplary embodiment of the present invention includes: a substrate; a plurality of thin film transistors disposed on the substrate; an overcoat disposed on the thin film transistor; a thin film pattern disposed on the overcoat, the thin film pattern comprising a plurality of first portions where the thin film is present and a plurality of second portions where the thin film is not present; a first electrode disposed on the thin film pattern; an organic light emitting member disposed on the first electrode; and a second electrode disposed on the organic light emitting member. The first portion and the second portion are alternately arranged.

25 Claims, 27 Drawing Sheets

FIG. 3
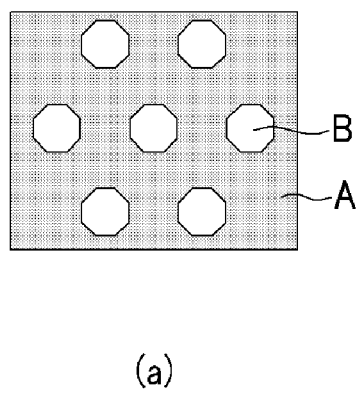
(a)
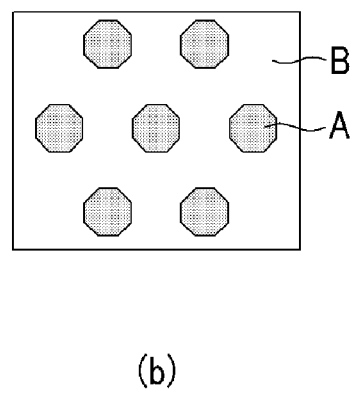
(b)
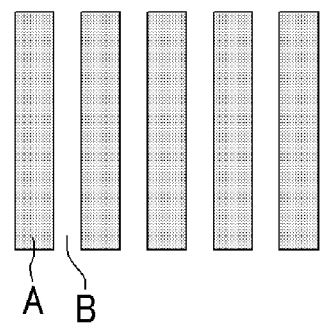
(c)

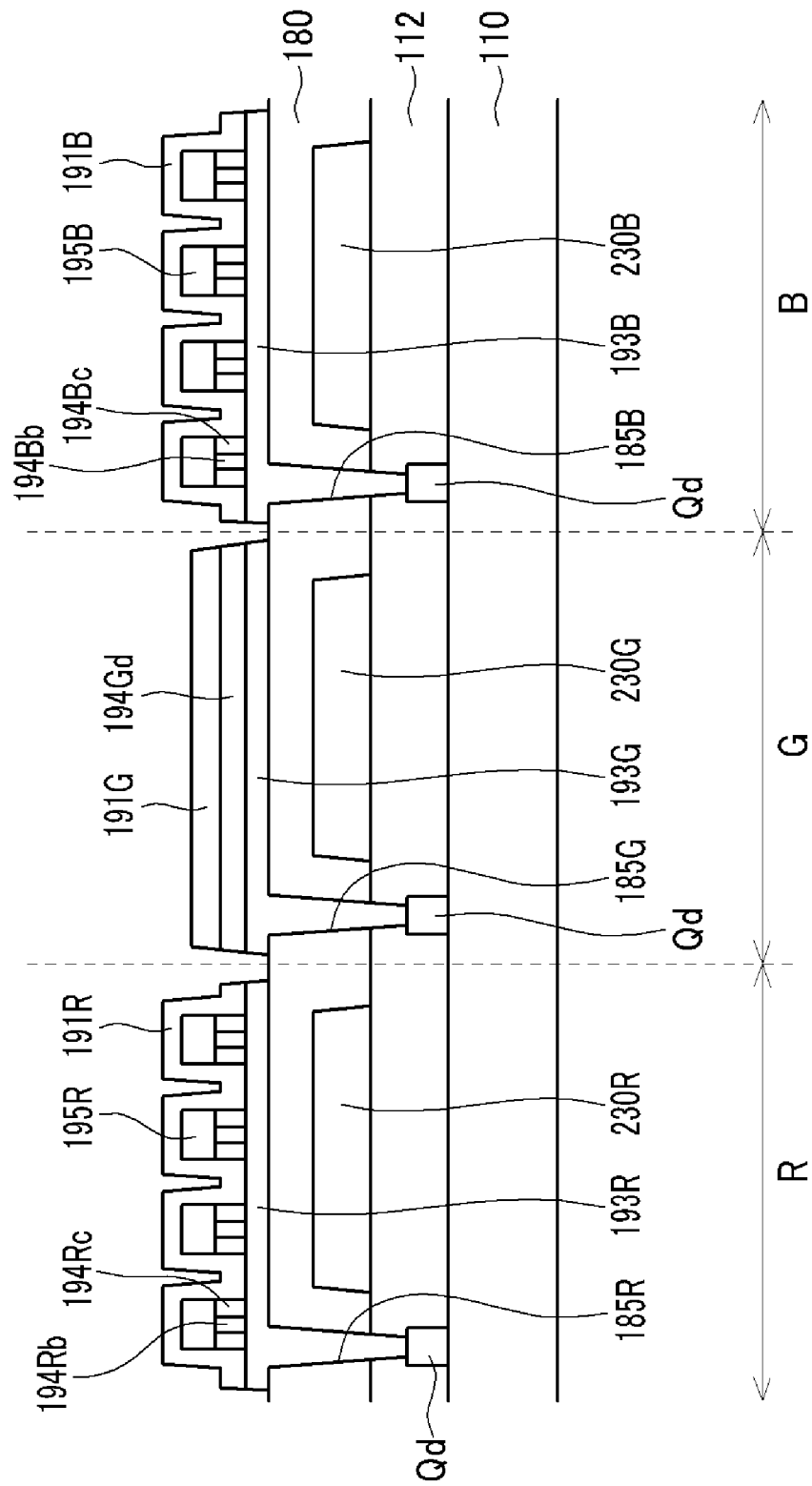

ORGANIC LIGHT EMITTING DISPLAY DEVICE AND METHOD FOR MANUFACTURING THE SAME

CROSS REFERENCE TO RELATED APPLICATION

This application claims priority from and the benefit of Korean Patent Application No. 10-2008-0092134, filed on Sep. 19, 2008, which is hereby incorporated by reference for all purposes as if fully set forth herein.

BACKGROUND OF THE INVENTION

1. Field of the Invention

The present invention relates to an organic light emitting display device and a method for manufacturing the same.

2. Discussion of the Invention

Among flat display devices, an organic light emitting display (OLED) device does not require a separate light source because it emits light by itself. Thus, using the organic light emitting display device is advantageous in a view of power consumption, response speed, viewing angle, and contrast ratio.

An organic light emitting display device includes a plurality of pixels such as a red pixel, a blue pixel, and a green pixel, and full colors may be achieved by combining light emitted from these pixels. Each pixel includes an organic light emitting element and a plurality of thin film transistors for driving it.

An organic light emitting element includes an anode, a cathode, and an organic light emitting member between them. The organic light emitting members may emit light of three primary colors such as red, green, and blue, or white. The material included in the organic light emitting member depends on the desired color of light. When the organic light emitting members emits white light, light emitting materials emitting light of red, green, and blue may be stacked to achieve white by combining red, green, and blue light. When the organic light emitting member emits white light, light having a desired color may be obtained by adding color filters.

SUMMARY OF THE INVENTION

The present invention provides an organic light emitting display device and a method for manufacturing the same.

Additional features of the invention will be set forth in the description which follows, and in part will be apparent from the description, or may be learned by practice of the invention.

The present invention discloses an organic light emitting display device that includes: a substrate; a plurality of thin film transistors disposed on the substrate; an overcoat disposed on the thin film transistors; a thin film pattern disposed on the overcoat, the thin film pattern comprising a plurality of first portions where the thin film is present and a plurality of second portions where the thin film is not present; a first electrode disposed on the thin film pattern; an organic light emitting member disposed on the first electrode; and a second electrode disposed on the organic light emitting member. The first portion and the second portion are alternately arranged.

The present invention also discloses an organic light emitting display device that includes a first pixel that displays a first color, a second pixel that displays a second color, and a third pixel that displays a third color. Each of the first pixel, the second pixel, and the third pixel comprises a thin film transistor, a lower transparent member disposed on the thin film transistor, a transparent pattern disposed on the lower transparent member, a first electrode disposed on the transparent pattern and connected to the thin film transistor, an organic light emitting member disposed on the first electrode, and a second electrode disposed on the organic light emitting member. The transparent pattern of the first pixel comprises a first portion where a transparent film is present and a second portion where the transparent film is not present, and the first portion and the second portion are alternately arranged.

The present invention also discloses a method for manufacturing an organic light emitting display device that includes a first pixel that displays a first color, a second pixel that displays a second color, and a third pixel that displays a third color, the method including forming a plurality of lower transparent members on a substrate, forming a transparent inorganic film layer by depositing a transparent inorganic material on the plurality of lower transparent members, forming a transparent inorganic film pattern in the first pixel, the second pixel, and the third pixel by etching the transparent inorganic film layer, respectively, each of the transparent inorganic film pattern including a first portion where a transparent inorganic film layer is present and a second portion where the transparent inorganic film layer is not present, and forming a plurality of first electrodes by depositing a conductive layer on the transparent inorganic film pattern of the first pixel, the second pixel, and the third pixel and etching the conductive layer.

The present invention also discloses a method for manufacturing an organic light emitting display device that includes a first pixel that displays a first color, a second pixel that displays a second color, and a third pixel that displays a third color, the method including depositing a lower transparent member layer, a transparent inorganic film layer and an upper transparent member layer on a substrate, forming an upper transparent pattern including a first portion where a transparent film is present and a second portion where the transparent film is not present on the first pixel, the second pixel, and the third pixel by etching the upper transparent member layer, forming a transparent inorganic film pattern that includes a third portion disposed inside of a boundary of the first portion of the upper transparent pattern on each of the first pixel, the second pixel, and the third pixel by overetching the transparent inorganic film layer using the upper transparent pattern as an etching mask, forming an air layer disposed outside of and along an edge of the third portion of the transparent inorganic film pattern and disposed under the first portion of the upper transparent pattern by depositing a first transparent conductive layer on the upper transparent pattern, and forming a plurality of lower transparent members and a plurality of pixel electrodes disposed in the first pixel, the second pixel, and the third pixel, respectively, by etching the first transparent conductive layer and the lower transparent member layer.

The present invention also discloses a method for manufacturing an organic light emitting display device that includes a first pixel that displays a first color, a second pixel that displays a second color, and a third pixel that displays a third color, the method including sequentially depositing a lower transparent member layer, a transparent inorganic film layer, and an upper transparent member layer on a substrate, forming an upper transparent pattern including a first portion where a transparent film is present and a second portion where the transparent film is not present in one pixel or two pixels among the first pixel, the second pixel, and the third pixel and exposing the transparent inorganic film layer of the remaining pixel by etching the upper transparent member layer, and exposing the transparent inorganic film layer of the remaining pixel, forming a photosensitive film pattern that comprises a third portion covering the exposed transparent inorganic film layer of the remaining pixel, forming a transparent inorganic film pattern that comprises a fourth portion disposed inside of a boundary of the first portion of the upper transparent pattern of the pixel including the upper transparent pattern among the first pixel, the second pixel, and the third pixel by overetching the transparent inorganic film layer using the upper transparent pattern and the photosensitive film pattern as an etching mask, removing the photosensitive film pattern, forming an air layer disposed outside of and along the fourth portion and disposed under the first portion of the upper transparent pattern by depositing a transparent conductive layer on the upper transparent pattern and the exposed transparent inorganic film layer, and forming a plurality of lower transparent members and a plurality of pixel electrodes in the first pixel, the second pixel, and the third pixel, respectively, by etching the transparent conductive layer and the lower transparent member layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 3 is a top plan view that shows various pattern forms of a thin film of an organic light emitting display device according to an exemplary embodiment of the present invention.

FIG. 24, FIG. 25, FIG. 26, and FIG. 27 are cross-sectional views at intermediate steps of a method for manufacturing an organic light emitting display device shown in FIG. 23 according to an exemplary embodiment of the present invention.

DETAILED DESCRIPTION OF THE ILLUSTRATED EMBODIMENTS

Figure 1:
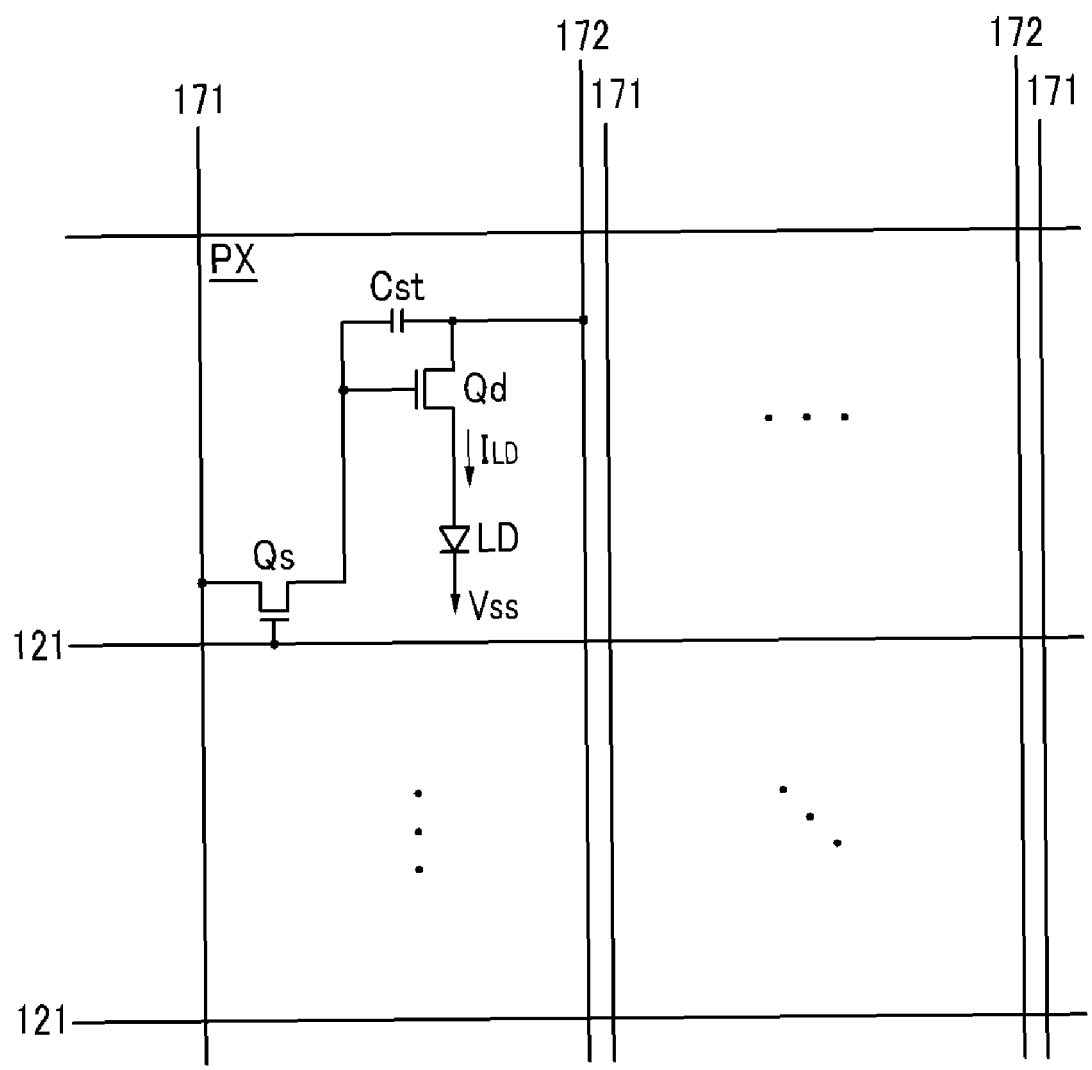
FIG. 1 is an equivalent circuit diagram of an organic light emitting display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Hereinafter, an organic light emitting display device according to an exemplary embodiment of the present invention will be described in detail with reference to FIG. 1.

FIG. 1 is an equivalent circuit diagram of an organic light emitting display device according to an exemplary embodiment of the present invention.

Referring to FIG. 1, an organic light emitting display device according to the present exemplary embodiment includes a plurality of signal lines 121, 171, and 172 and a plurality of pixels that are connected to the plurality of signal lines 121, 171, and 172. The plurality of pixels are arranged in an approximate matrix form.

The signal lines include a plurality of gate lines 121 that transfer gate signals (or scanning signals), a plurality of data lines 171 (data lines) that transfer data signals, and a plurality of driving voltage lines 172 (driving voltage lines) that transfer driving voltages. The gate lines 121 extend in a row direction and are substantially parallel to each other, and the data lines 171 and the driving voltage line 172 extend in an column direction and are substantially parallel to each other. The present exemplary embodiment shows the driving voltage lines 172 extending in a column direction, but they may alternatively extend in a row direction and a column direction to form a disposed net.

Each pixel PX includes a switching transistor Qs, a driving transistor Qd, a storage capacitor Cst, and an organic light emitting element LD.

The switching transistor Qs includes a control terminal, an input terminal, and an output terminal, wherein the control terminal is connected to the gate line 121, the input terminal is connected to the data line 171, and the output terminal is connected to the driving transistor Qd. The switching transistor Qs responds to a scanning signal received from the gate line 121 to transfer a data signal received from the data line 171 to the driving transistor Qd.

The driving transistor Qd also includes a control terminal, an input terminal, and an output terminal, wherein the control terminal is connected to the switching transistor Qs, the input terminal is connected to the driving voltage line 172, and the output terminal is connected to the organic light emitting element LD. The driving transistor Qd transfers an output current $I_{LD}$ whose magnitude varies depending on a voltage applied between the control terminal and the input terminal.

The capacitor Cst is connected between the control terminal and the input terminal of the driving transistor Qd. The capacitor Cst charges the data signal applied to the control terminal of the driving transistor Qd and maintains it even after the switching transistor Qs is turned off.

The organic light emitting element LD, which may be an organic light emitting diode (OLED), includes an anode connected to the output terminal of the driving transistor Qd and a cathode connected to a common voltage Vss. The organic light emitting element LD emits light having an intensity depending on the output current $I_{LD}$ of the driving transistor Qd, thereby displaying an image. The organic light emitting element LD may include an organic material that uniquely emits at least one color of light among three primary colors of red, green, and blue, or may include an organic material that emits white light. The organic light emitting display device may display a desired image by a spatial sum of those colors.

The switching transistor Qs and the driving transistor Qd may be n-channel electric field effect transistors (FETs), but at least one of the switching transistor Qs and the driving transistor Qd may be a p-channel electric field effect transistor. Also, a connection relationship between the transistors (Qs and Qd), the capacitor Cst, and the organic light emitting element LD may be changed.

Hereinafter, a detailed structure of the organic light emitting display device will be described in detail with reference to FIG. 2 and FIG. 3 as well as FIG. 1.

Figure 2:
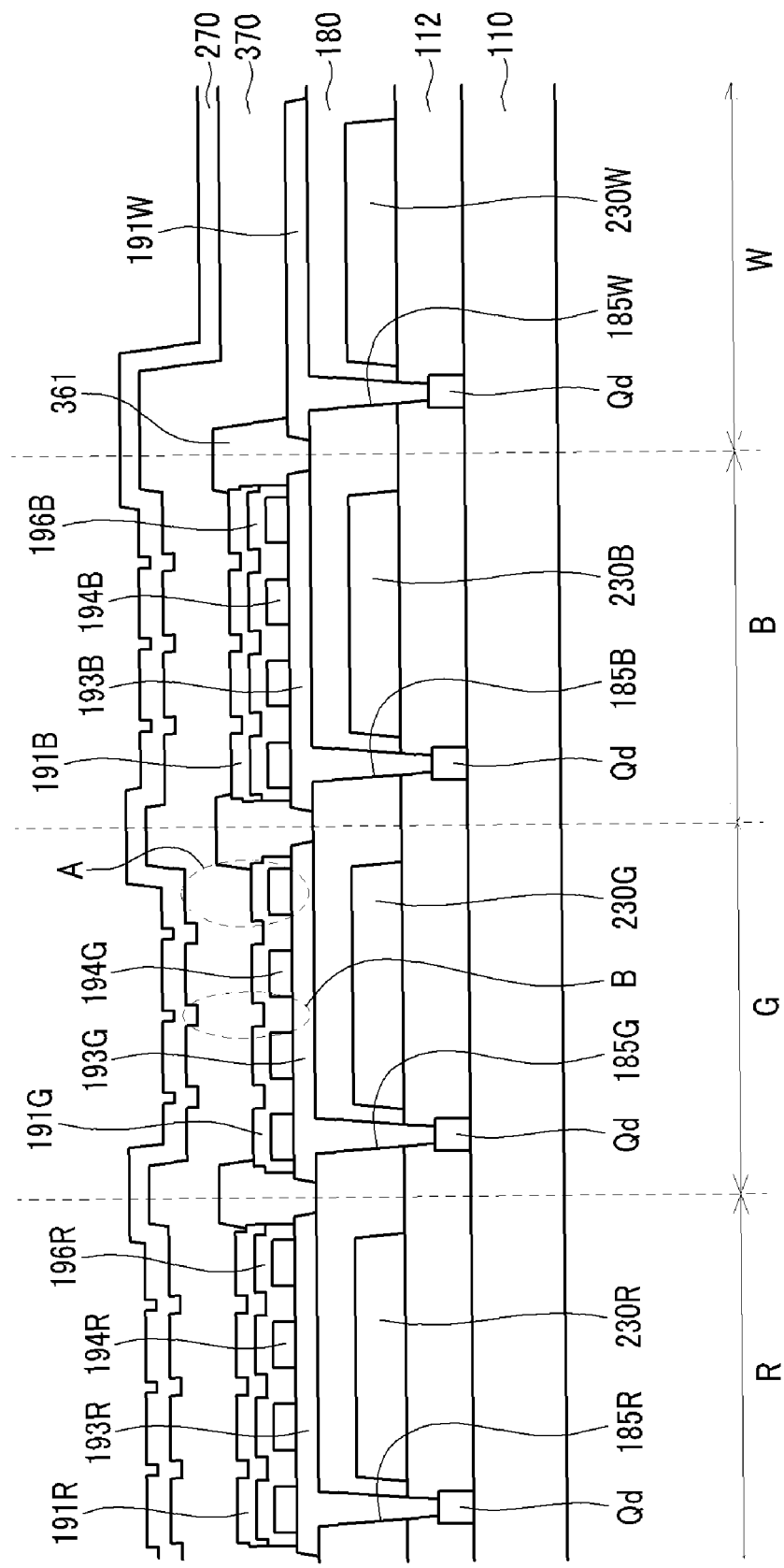
FIG. 2 is a cross-sectional view of an organic light emitting display device according to an exemplary embodiment of the present invention.

FIG. 2 is a cross-sectional view of an organic light emitting display device according to an exemplary embodiment of the present invention, and FIG. 3 is a top plan view that shows various pattern forms of a thin film of an organic light emitting display device according to an exemplary embodiment of the present invention.

On an insulation substrate 110 that may be made of transparent glass or plastic, a thin film transistor array that includes a plurality of switching transistors (not shown) and a plurality of driving transistors Qd is disposed. The switching transistor (not shown) and the driving transistor Qd are described above, thus the description thereof will be omitted.

An insulating layer 112 is disposed on the thin film transistor array Qd.

On the insulating layer 112, a red color filter 230R is disposed in the red pixel R, a green color filter 230G is disposed in the green pixel G, a blue color filter 230B is disposed in the blue pixel B, and a transparent white color filter 230W is disposed in the white pixel W. The white color filter 230W of the white pixel W may be omitted.

An overcoat 180 is disposed on the color filters 230R, 230G, 230B, and 230W and the insulating layer 112. The overcoat 180 may be made of an organic material and may have a flat surface.

A plurality of contact holes 185R, 185G, 185B, and 185W are formed in the insulating layer 112 and the overcoat 180, for exposing a portion of an output terminal (not shown) of the driving transistor Qd.

A plurality of lower transparent members 193R, 193G, and 193B are disposed on the overcoats 180 of the red, green, and blue pixels R, G, and B. The lower transparent members 193R, 193G, and 193B may be made of indium tin oxide (ITO) or indium zinc oxide (IZO), and are electrically connected to the lower driving transistors Qd through the contact holes 185R, 185G, and 185B. The thicknesses of the lower transparent members 193R, 193G, and 193B of the red, green, and blue pixels R, G, and B may be integer multiples of ¼ of the respective wavelengths corresponding to red, green, and blue colors R, G, and B.

Transparent inorganic film patterns 194R, 194G, and 194B are disposed on the lower transparent members 193R, 193G, and 193B of the red, green, and blue pixels R, G, and B.

The transparent inorganic film patterns 194R, 194G, and 194B include an "A" region where the transparent inorganic film is present and a "B" region where the transparent inorganic film is not present. The A and the B regions may be regularly and alternately arranged.

The shapes of the transparent inorganic film patterns 194R, 194G, and 194B will be described in detail with reference to FIG. 3.

As shown in FIG. 3(a) and FIG. 3(b), a plurality of B regions where the transparent inorganic film is not present or a plurality of A regions where the transparent inorganic film is present may be arranged while forming a surface core hexagonal or triangular structure. Unlike this, the A region or the B region of the red, green, and blue pixels R, G, and B may be irregularly arranged or may be regularly arranged while forming structure shapes, such as polygons, circles, or ovals, which are different from the arrangement structure of FIGS. 3(a) and 3(b). The shape of each A region or B region may be, for example, polygonal, circular, or oval. In each pixel R, G, and B, the number of the A regions or the B regions, the distance between the arranged A regions and B regions, the shape of each A region or B region, or the area thereof may vary.

Meanwhile, with reference to the exemplary embodiment shown in FIG. 3(c), the A region and the B region may be alternately arranged while having a long band shape in a vertical direction. The band-shaped width of the A region and the B region may vary according to conditions.

Alternatively to FIG. 3, the transparent inorganic film patterns 194R, 194G, and 194B of each pixel R, G, and B may be divided into one A region and one B region.

The transparent inorganic film patterns 194R, 194G, and 194B may be made of a transparent inorganic material such as silicon nitride (SiNx) or silicon oxide (SiOx), and the refractive index of the transparent inorganic film patterns 194R, 194G, and 194B may be lower than the refractive index of the lower transparent members 193R, 193G, and 193B. The thickness of the transparent inorganic film patterns 194R, 194G, and 194B may be integer multiples of ¼ of the wavelengths corresponding to each color of R, G, and B.

Supplementary transparent members 196R and 196B are disposed on the transparent inorganic film patterns 194R and 194B of the red and blue pixels R and B. The supplementary transparent members 196R and 196B may be made of a transparent conductive material such as ITO or IZO, and the thicknesses of the transparent members 196R and 196B are substantially the same.

A plurality of pixel electrodes 191R, 191G, 191B, and 191W are disposed on the transparent members 196R and 196B of the red and blue pixels R and B, the transparent inorganic film pattern 194G of the green pixel G, and the overcoat 180 of the white pixel W. Each pixel electrode 191R, 191G, 191B, and 191W is disposed on a region corresponding to each color filter 230R, 230G, 230B, and 230W. The pixel electrode 191W of the white pixel W is electrically connected to the driving transistor Qd through the contact hole 185W.

In the A region of the transparent inorganic film patterns 194R, 194G, and 194B, because of a difference in the refractive indices of the lower transparent members 193R, 193G, and 193B and the transparent inorganic film patterns 194R, 194G, and 194B, and a difference in the refractive indices of the transparent inorganic film patterns 194R, 194G, and 194B and the supplementary transparent members 196R and 196B or the pixel electrode 191G, a portion of incident light from the upper side is reflected at the boundaries thereof. When there is a difference in the refractive indices of the overcoat 180 and the lower transparent members 193R, 193G, and 193B, a portion of the incident light from the upper side may be reflected at the boundary of the overcoat 180 and the lower transparent members 193R, 193G, and 193B. Thereby, the lower transparent members 193R, 193G, and 193B, the transparent inorganic film patterns 194R, 194G, and 194B, and the supplementary transparent members 196R and 196B or the pixel electrode 191G altogether have transflective characteristics to partially reflect or transmit incident light.

A plurality of insulation members 361 are disposed between adjacent pixel electrodes 191R, 191G, 191B, and 191W. The insulation members 361 may be omitted.

A white organic light emitting member 370 is disposed on the entire surface of the insulation members 361 and the pixel electrodes 191R, 191G, 191B, and 191W, and a common electrode 270 for transmitting a common voltage Vss is disposed thereon.

The white organic light emitting member 370 may have a structure in which a plurality of organic material layers for emitting different colors of light among the primary colors are layered. The common electrode 270 may be made of a reflective metal that includes calcium (Ca), barium (Ba), magnesium (Mg), aluminum (Al), silver (Ag), or the like.

Alternatively, organic light emitting members (not shown) uniquely emitting light of one among red, green, and blue, and a white organic light emitting member may be respectively disposed in the red, green, blue, and white pixels R, G, B, and W. At least one of the red, green, blue, and white color filters 230R, 230G, 230B, and 230W may be omitted.

In an organic light emitting display device, one pixel electrode 191R, 191G, 191B, and 191W, the organic light emitting member 370, and the common electrode 270 form an organic light emitting element LD. Each pixel electrode 191R, 191G, 191B, and 191W functions as an anode, and the common electrode 270 functions as a cathode.

Such an organic light emitting display device emits light downward with respect to the substrate 110 to display an image. Light that is emitted from the organic light emitting member 370 toward the substrate 110 is transmitted outside through the pixel electrode 191W in the white pixel W, and in the remaining pixels R, G, and B, the light is transmitted through the pixel electrodes 191R, 191G, and 191B and the supplementary transparent members 196R and 196B (except for the green pixel G) and reaches the transparent inorganic film patterns 194R, 194G, and 194B. The incident light that reaches the B region of the transparent inorganic film patterns 194R, 194G, and 194B directly arrives at the lower transparent members 193R, 193G, and 193B, but the incident light that reaches the A region of the transparent inorganic film patterns 194R, 194G, and 194B is reflected toward the common electrode 270, and then, the common electrode 270 reflects it again. Meanwhile, the incident light that passes through the A region of the transparent inorganic film patterns 194R, 194G, and 194B is reflected at the boundary between the lower transparent members 193R, 193G, and 193B and the transparent inorganic film patterns 194R, 194G, and 194B, and the phase thereof may be the same as the phase of light that is reflected at the upper sides of the transparent inorganic film patterns 194R, 194G, and 194B. As described above, light that reciprocates between the upper boundary or the lower boundary of the A region of the transparent inorganic film patterns 194R, 194G, and 194B and the common electrode 270 is subjected to an optical process such as interference and emitted through the lower transparent members 193R, 193G, and 193B and the color filters 230R, 230G, and 230B to the outside if an appropriate condition is satisfied.

Since an optical path length varies according to the thicknesses and refractive indices of thin films including the transparent members 196R and 196B disposed between the transparent inorganic film patterns 194R, 194G, and 194B and the common electrode 270, light of the wavelengths corresponding to red, green, and blue may be intensified by appropriately selecting the thicknesses and materials of such thin films. In this way, desired optical characteristics may be obtained, and in particular, light having a desired range of wavelengths of red, green, and blue, and a desired color purity may be obtained.

As described above, by providing both a region A in which light of the corresponding wavelength undergoes constructive interference and a region B in which light of the corresponding wavelength does not undergo constructive interference in one pixel R, G, and B, variation of spectrum and luminance according to viewing angles may be reduced and color variation according to viewing angles may be reduced.

In addition, since total reflection may be reduced by the transparent inorganic film patterns 194R, 194G, and 194B, light efficiency may be increased, and a change in luminance and color variation according to viewing angles may be reduced by scattering of light, thereby improving the display characteristics.

In addition, since the shapes of the transparent inorganic film patterns 194R, 194G, and 194B are transferred to the overlying pixel electrodes 191R, 191G, and 191B, the contact area of the pixel electrodes 191R, 191G, and 191B with the organic light emitting member 370 is increased, and thus the resistance may be reduced.

Alternatively, in order to reduce color variation of emitted white light according to viewing angles and to increase the luminance, an intensive structure including elements corresponding to the lower transparent members 193R, 193G, and 193B, the transparent inorganic film patterns 194R, 194G, and 194B, and the transparent members 196R and 196B of the red, blue, and green pixels R, G, and B may be disposed in the white pixel W. Alternatively, the white pixel W may be omitted.

Alternatively the lower transparent members 193R, 193G, and 193B or the supplementary transparent members 196R and 196B may be made of silicon oxide or silicon nitride. In this case, the transparent inorganic film patterns 194R, 194G, and 194B may be made of a transparent inorganic material different from the lower transparent members 193R, 193G, and 193B and the supplementary transparent members 196R and 196B. In this case, the pixel electrode 191R, 191G, and 191B of each pixel R, G, and B may be directly connected to the driving transistor Qd through a contact hole (not shown).

Hereinafter, a manufacturing method of the organic light emitting display device that is shown in FIG. 2 will be described in detail with reference to FIG. 4, FIG. 5, FIG. 6, FIG. 7, FIG. 8, and FIG. 9.

FIG. 4, FIG. 5, FIG. 6, FIG. 7, FIG. 8, and FIG. 9 are cross-sectional views at intermediate steps of a method for manufacturing an organic light emitting display device shown in FIG. 2 according to an exemplary embodiment of the present invention.

Figure 4:
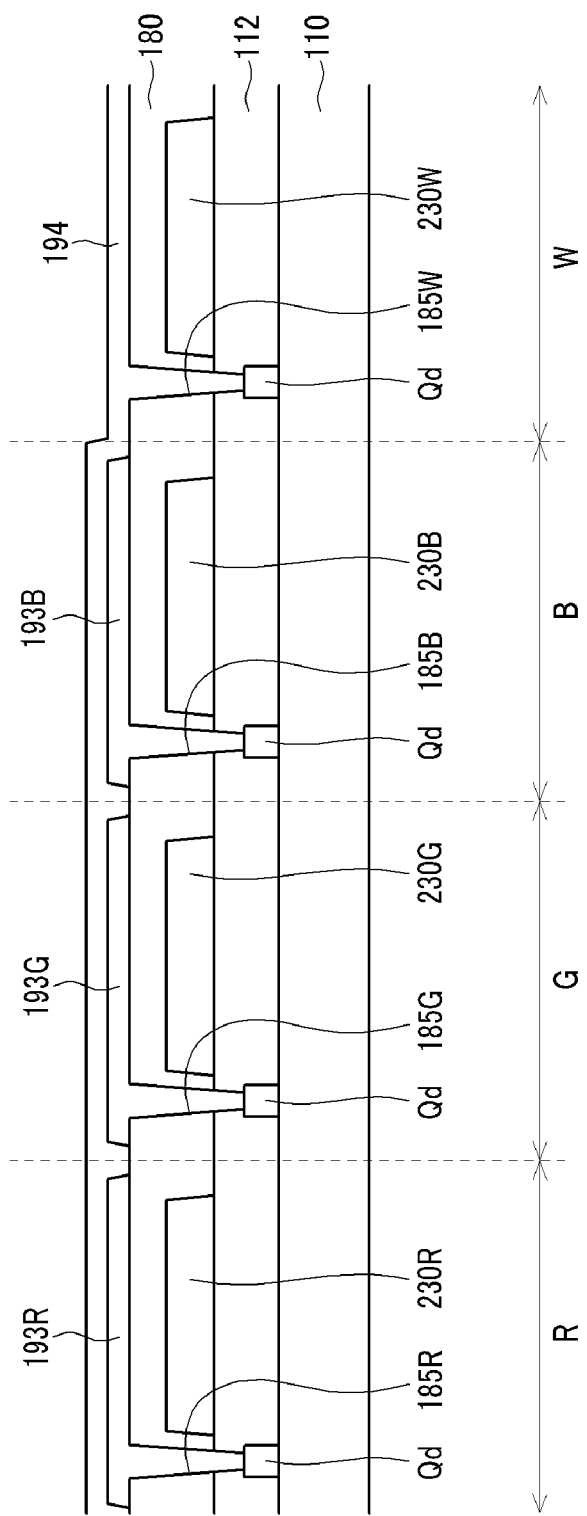
FIG. 4, FIG. 5, FIG. 6, FIG. 7, FIG. 8, and FIG. 9 are cross-sectional views at intermediate steps of a method for manufacturing an organic light emitting display device shown in FIG. 2 according to an exemplary embodiment of the present invention.

With reference to FIG. 4, a thin film transistor array that includes a plurality of driving transistors Qd is formed on an insulation substrate 110. Then, an insulating layer 112, a plurality of color filters 230R, 230G, 230B, and 230W and an overcoat 180 are sequentially formed thereon.

Subsequently, by patterning the insulating layer 112 and the overcoat 180, a plurality of contact holes 185R, 185G, 185B, and 185W exposing a portion of the driving transistors Qd are formed, and lower transparent members 193R, 193G, and 193B are formed on the overcoat 180 of the red, green, and blue pixels R, G, and B. Subsequently, on the overcoat 180 and the lower transparent members 193R, 193G, and 193B of the red, green, and blue pixels R, G, and B, a transparent inorganic material such as silicon nitride or silicon oxide is deposited to form a transparent inorganic film layer 194.

Figure 5:
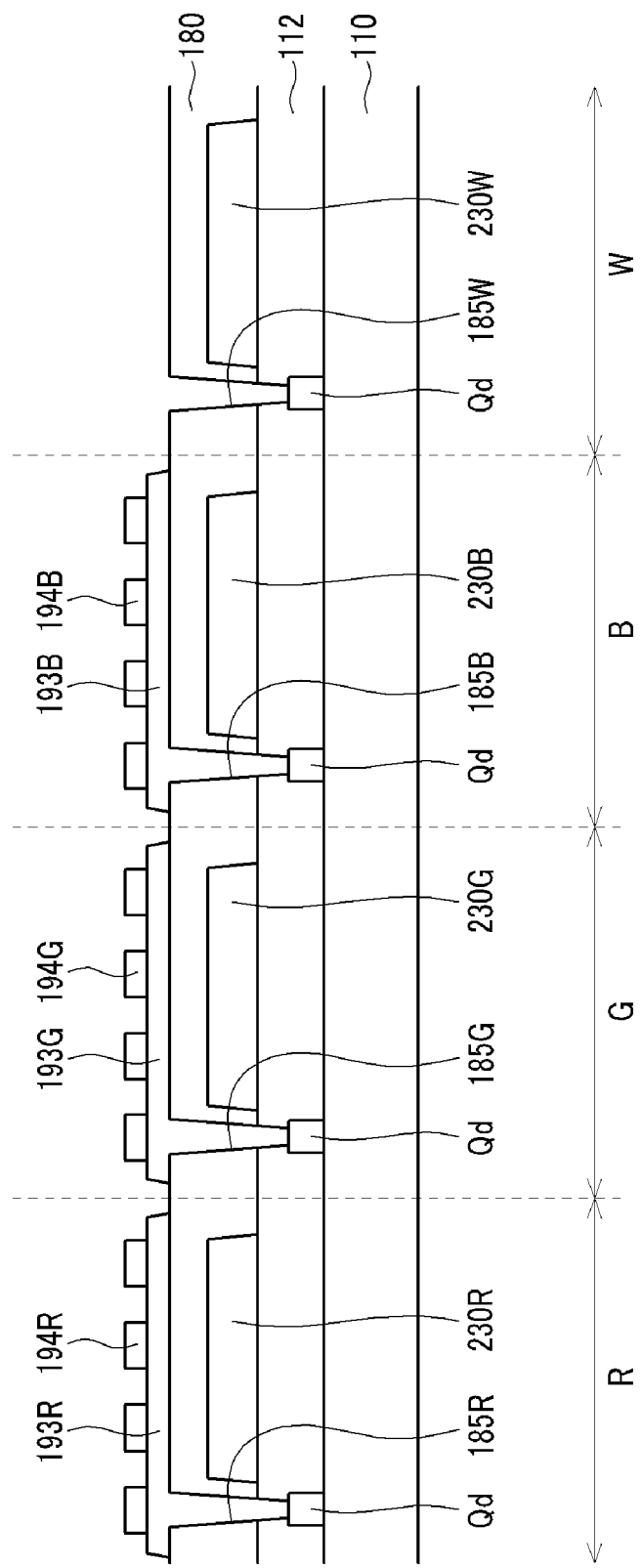

Next, with reference to FIG. 5, transparent inorganic film patterns 194R, 194G, and 194B are formed, by photolithographic etching of the transparent inorganic film layer 194, in the red, green, and blue pixels R, G, and B, respectively.

Figure 6:
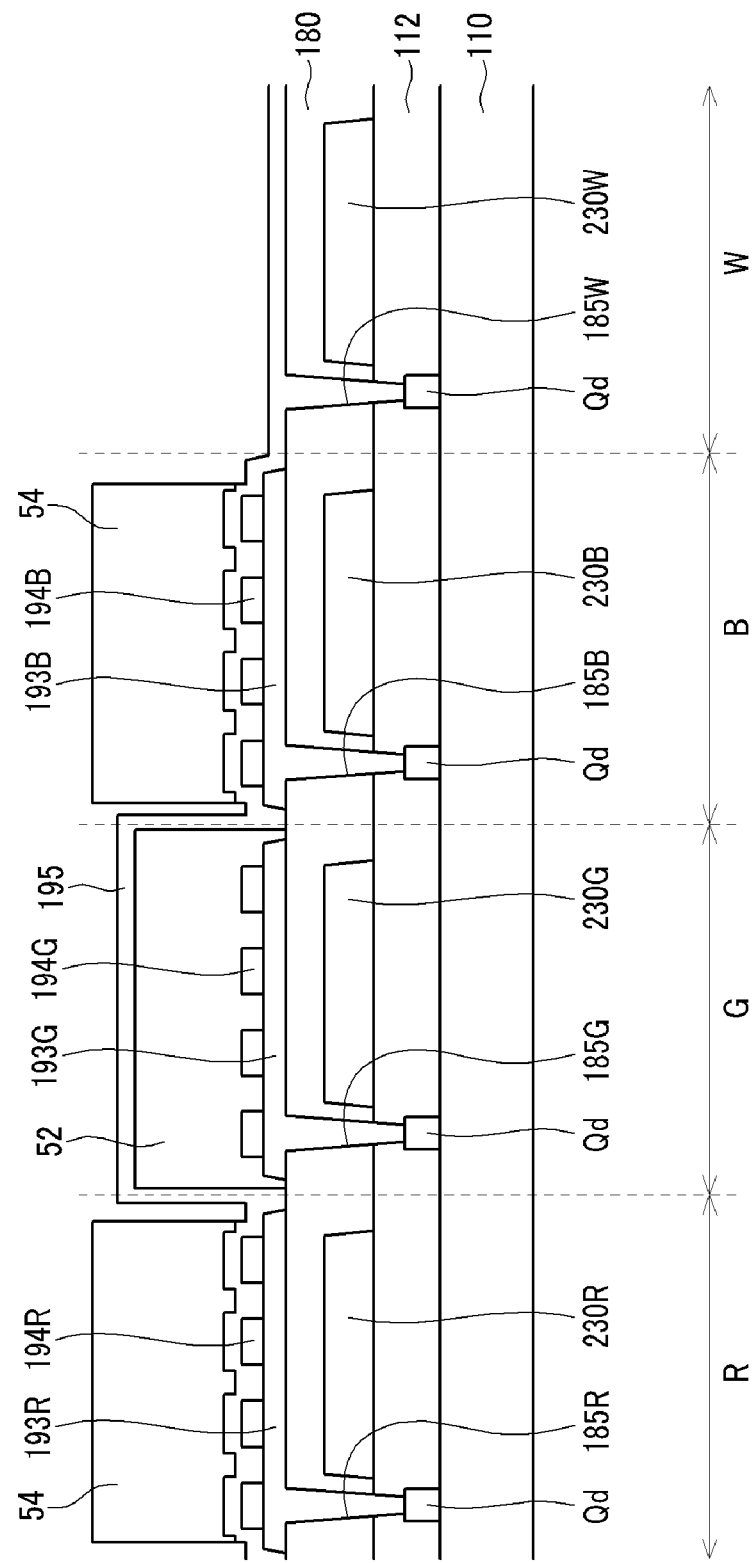

Next, with reference to FIG. 6, by coating a photosensitive film, exposing the film to light, and developing it, a photosensitive film pattern 52 is formed. The photosensitive film pattern 52 covers the transparent inorganic film pattern 194G and the lower transparent member 193G of the green pixel G.

Subsequently, a transparent member layer 195 such as ITO or IZO is deposited using a sputtering method or the like, and a photosensitive film is coated thereon. Then, the photosensitive film is exposed to light and developed to form a photosensitive film pattern 54 that covers the transparent member layer 195 of the red and blue pixels R and B.

Figure 7:
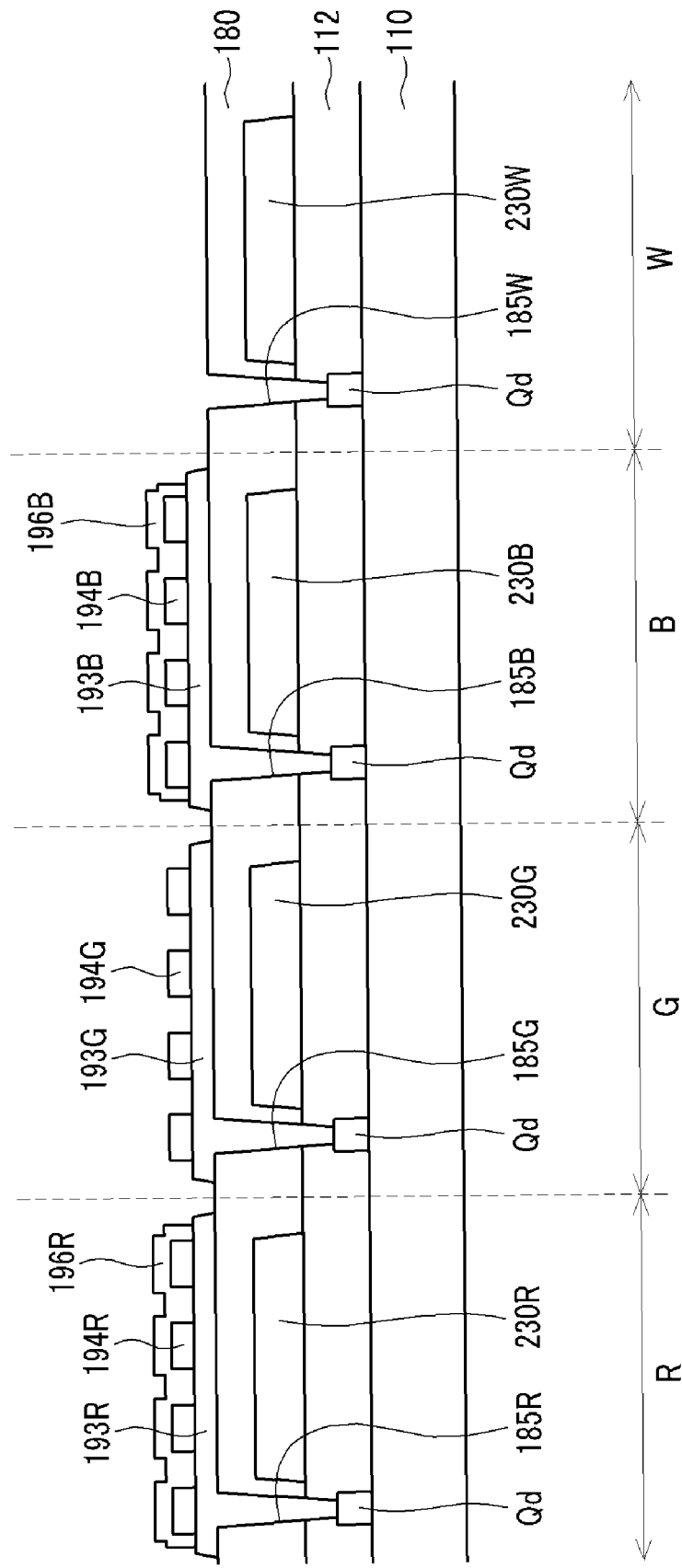

Next, with reference to FIG. 7, by etching the transparent member layer 195 using the photosensitive film pattern 54 as a mask, supplementary transparent members 196R and 196B are formed. Then, the photosensitive film patterns 52 and 54 are removed. At this time, when the transparent member layer 195 is etched, the photosensitive film pattern 52 protects the transparent inorganic film pattern 194G of the green pixel G from an etching solution.

Figure 8:
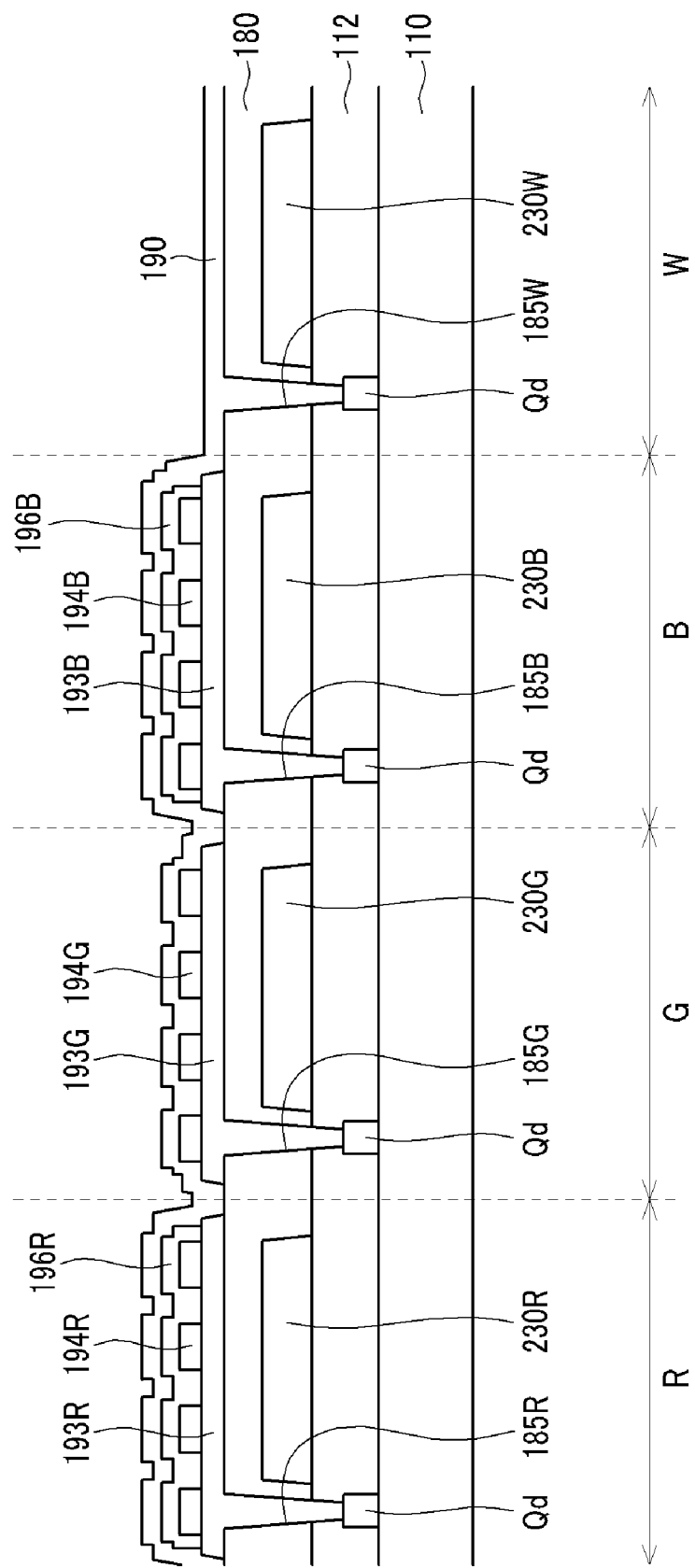
Figure 9:
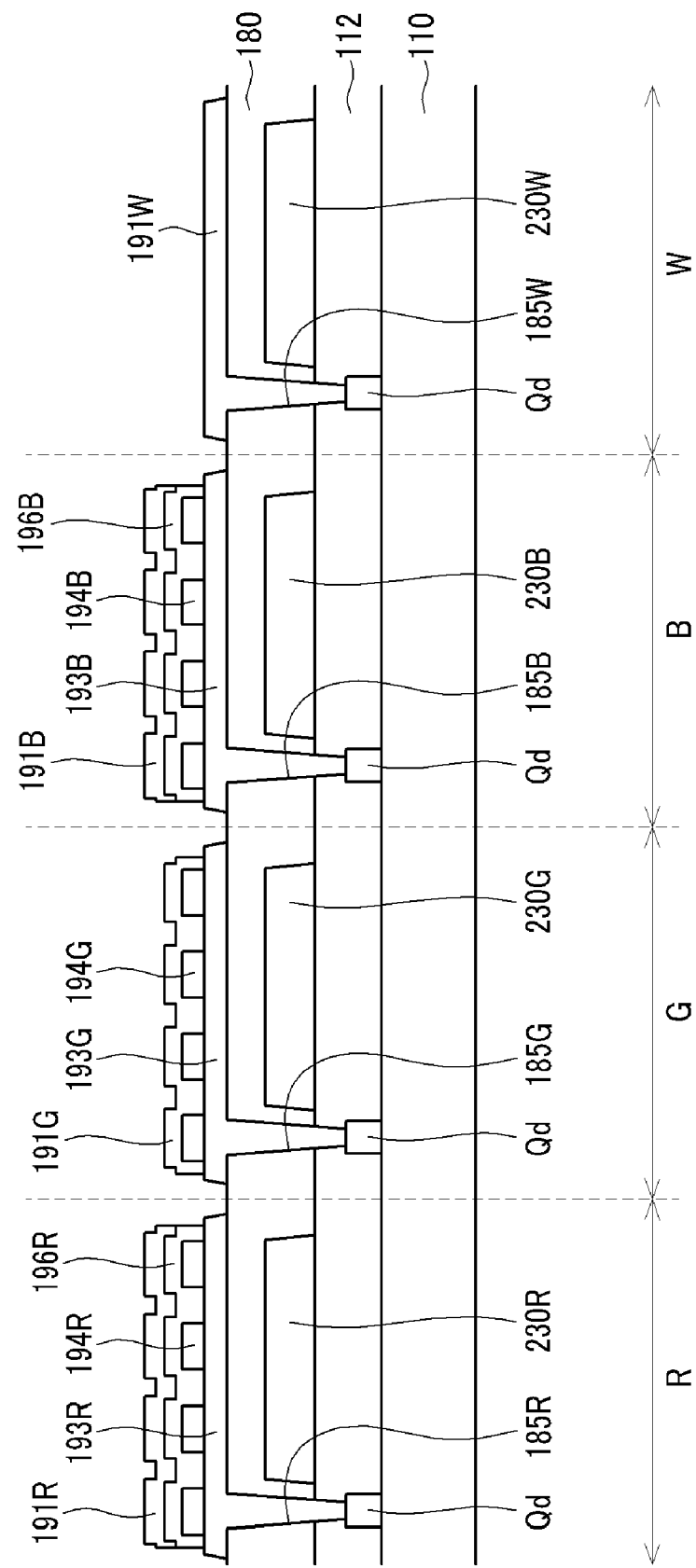

Next, with reference to FIG. 8 and FIG. 9, a transparent conductive layer 190 such as ITO or IZO is deposited on an entire surface of the substrate and subjected to photolithography to form a plurality of pixel electrodes 191R, 191G, 191B, and 191W.

Finally, as shown in FIG. 2, a plurality of insulation members 361, a white organic light emitting member 370, and a common electrode 270 are sequentially formed.

An organic light emitting display device according to another exemplary embodiment of the present invention will be described in detail with reference to FIG. 10 in conjunction with FIG. 1 and FIG. 2.

Figure 10:
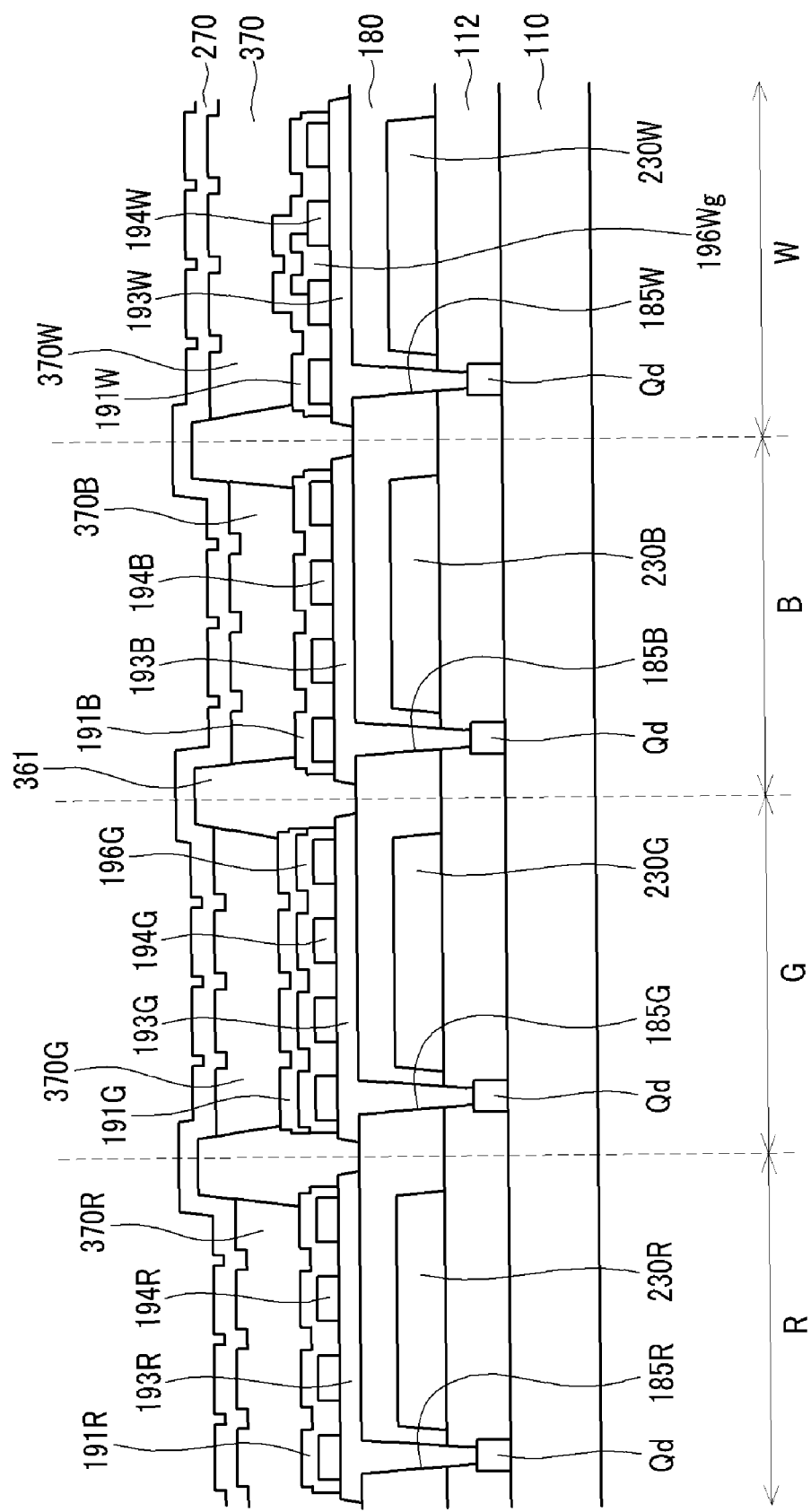
FIG. 10, FIG. 11, and FIG. 12 are cross-sectional views of an organic light emitting display device according to an exemplary embodiment of the present invention.

FIG. 10 is a cross-sectional view of an organic light emitting display device according to an exemplary embodiment of the present invention.

The same descriptions as the above exemplary embodiment will be omitted and the same constituent elements are provided with the same reference numerals.

On an insulation substrate 110, a thin film transistor array Qd, an insulating layer 112, a plurality of color filters 230R, 230G, 230B, and 230W, an overcoat 180, a plurality of lower transparent members 193R, 193G, 193B, and 193W, a plurality of transparent inorganic film patterns 194R, 194G, 194B, and 194W, supplementary transparent members 196G and 196Wg (corresponding to green and white pixels G and W), a plurality of pixel electrodes 191R, 191G, 191B, and 191W, insulation members 361, organic light emitting members 370R, 370G, 370B, and 370W and a common electrode 270 are sequentially disposed.

In the present exemplary embodiment, unlike the exemplary embodiment that is shown in FIG. 2, a lower transparent member 193W, and a transparent inorganic film pattern 194W are disposed in the white pixel W. Further, a supplementary transparent member 196G is disposed on the transparent inorganic film pattern 194G of the green pixel G, and a supplementary transparent member 196Wg is disposed on a portion of the transparent inorganic film pattern 194W of the white pixel W. The thicknesses and refractive indices of the supplementary transparent member 196G of the green pixel G and the supplementary transparent member 196Wg of the white pixel W are the same.

In respective pixels R, G, B, and W, light that reciprocates between the transparent inorganic film patterns 194R, 194G, 194B, and 194W and the common electrode 270 is intensified by undergoing constructive interference with an optical path length that is different from that of the above exemplary embodiment. Particularly, in the white pixel W, light that passes through the supplementary transparent member 196Wg while traveling between the transparent inorganic film pattern 194W and the common electrode 270 has an intensity reinforced in the wavelength corresponding to green like the green pixel G. However, light not passing through the supplementary transparent member 196Wg while traveling between the transparent inorganic film pattern 194W and the common electrode 270 has intensities reinforced in the wavelengths corresponding to red and blue. Therefore, if an area of the supplementary transparent member 196Wg is appropriately selected, the intensities of light that corresponds to the primary colors R, G, and B that are reinforced by constructive interference may be controlled, and thus white light having high luminance may be emitted. Thereby, color purity may be improved and color variation and variation in color coordinates according to viewing angles may be reduced.

In addition, by forming the lower transparent member 193W, the transparent inorganic film pattern 194W, and the supplementary transparent member 196Wg in the white pixel W, similar to the remaining pixels R, G, and B, a step difference between the white pixel W and the remaining pixels R, G, and B may be prevented. Also, in a manufacturing process, the yield of product may be increased.

Alternatively, a supplementary transparent member (not shown) may be disposed on the transparent inorganic film pattern 194R and 194B of the red and blue pixels R and B, and a supplementary transparent member (not shown) having the same condition as the supplementary transparent member (not shown) of the red and blue pixels R and B may be disposed on a portion of the transparent inorganic film pattern 194W of the white pixel W.

Meanwhile, in an organic light emitting display device according to the present exemplary embodiment, red, green, blue, and white organic light emitting members 370R, 370G, 370B, and 370W are respectively disposed in the openings that are surrounded by the insulation members 361 in the respective pixels R, G, B, and W. According to the present exemplary embodiments, color purity of each primary color may be improved. The color filters 230R, 230G, 230B, and 230W may be omitted.

Various characteristics and effects of the above exemplary embodiment may be applied to the present exemplary embodiment.

An organic light emitting display device according to another exemplary embodiment of the present invention will be described in detail with reference to FIG. 11 as well as FIG. 1, FIG. 2, and FIG. 3.

Figure 11:
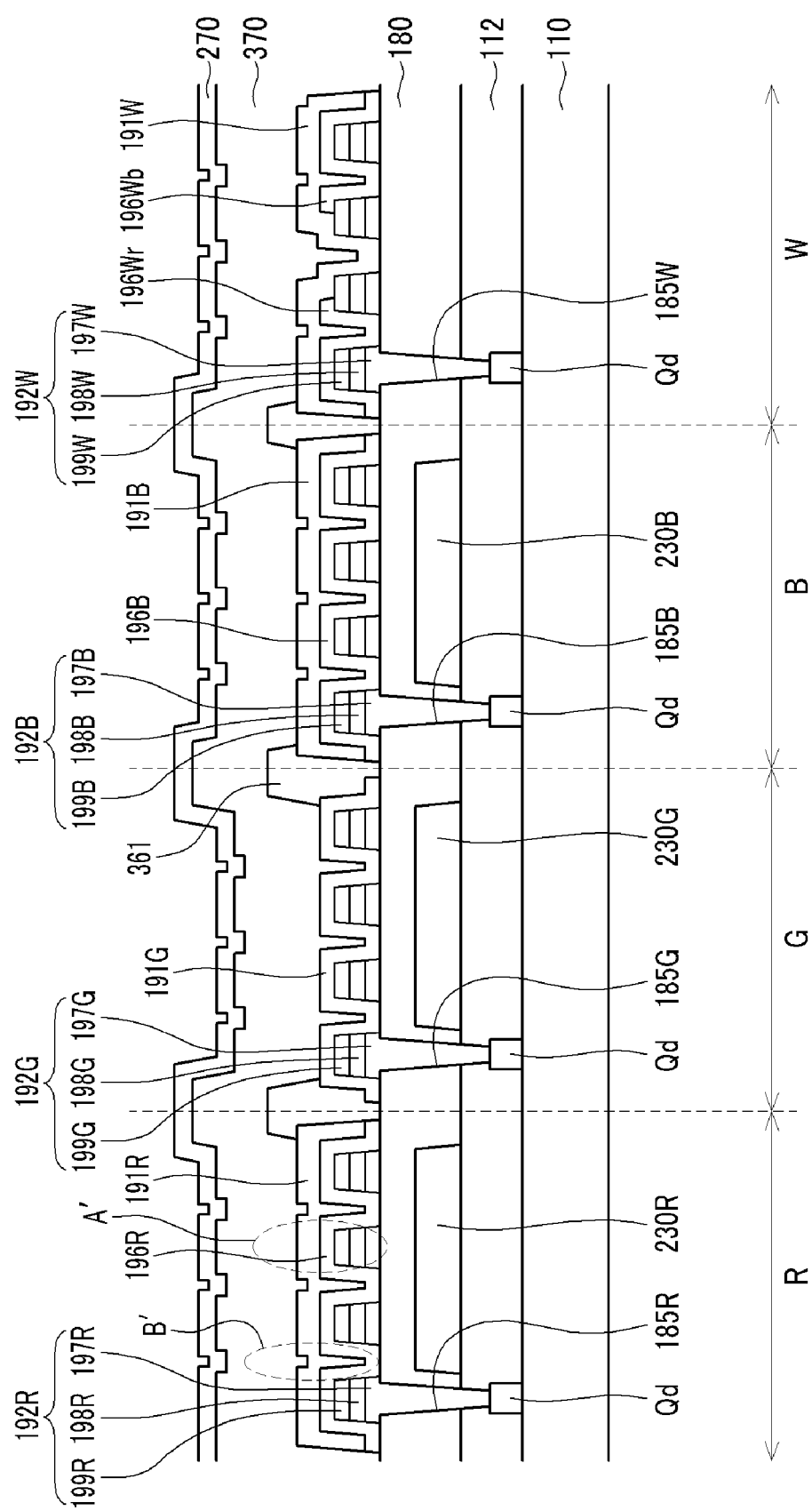

FIG. 11 is a cross-sectional view of an organic light emitting display device according to an exemplary embodiment of the present invention.

The same descriptions as the above exemplary embodiment will be omitted, and the same constituent elements are provided with the same reference numerals.

On an insulation substrate 110, a thin film transistor array Qd, an insulating layer 112, a plurality of color filters 230R, 230G, and 230B, an overcoat 180, a plurality of transflective member patterns 192R, 192G, 192B, and 192W, a supplementary transparent members 196R, 196B, 196Wr, and 196Wb (except for the green pixel G), a plurality of pixel electrodes 191R, 191G, 191B, and 191W, insulation members 361, a white organic light emitting member 370, and a common electrode 270 are sequentially disposed.

The organic light emitting display device according to the present exemplary embodiment does not include any color filter in the white pixel W, unlike the exemplary embodiment of FIG. 2.

In addition, transflective member patterns 192R, 192G, 192B, and 192W are respectively disposed on the overcoat 180 of the red, green, blue, and white pixels R, G, B, and W.

The transflective member patterns 192R, 192G, 192B, and 192W include transflective metal members 198R, 198G, 198B, and 198W that may be made of a metal and lower and upper oxide conductive members 197R, 197G, 197B, 197W, 199R, 199G, 199B, and 199W that may be made of ITO or IZO. The planar shapes of the transflective metal members 198R, 198G, 198B, and 198W and the lower and upper oxide conductive members 197R, 197G, 197B, 197W, 199R, 199G, 199B, and 199W may be the same as each other. Each transflective member pattern 192R, 192G, 192B, and 192W includes an "A'" region in which a transflective member is present and a "B'" region in which no transflective member is present. The transflective member patterns 192R, 192G, 192B, and 192W may have the same shape as the pattern shapes of the transparent inorganic film patterns 194R, 194G, and 194B of the exemplary embodiment shown in FIG. 2.

The transflective metal members 198R, 198G, 198B, and 198W may be made of a metal that has high reflectivity such as silver or aluminum, and the thickness thereof may be in the range of about 50 Å-200 Å. As described above, even if a metal has a small thickness, it may have transflective characteristics to partially reflect or transmit incident light.

The lower oxide conductive members 197R, 197G, 197B, and 197W and the upper oxide conductive members 199R, 199G, 199B, and 199W are positioned under and on the respective transflective metal members 198R, 198G, 198B, and 198W, and may improve adhesiveness of the transflective metal members 198R, 198G, 198B, and 198W with another layer and prevent corrosion. A portion of the lower oxide conductive members 197R, 197G, 197B, and 197W may be connected to the driving transistors Qd through contact holes 185R, 185G, 185B, and 185W.

Meanwhile, in the present exemplary embodiment, unlike the exemplary embodiment that is shown in FIG. 2, supplementary transparent members 196Wr and 196Wb are disposed on the transflective member pattern 192W of the white pixel W. The thicknesses and refractive indexes of the supplementary transparent members 196R and 196B of the red and blue pixels R and B and the supplementary transparent members 196Wr and 196Wb of the white pixel W may be the same.

Light that is emitted from the white organic light emitting member 370 reciprocates between the transflective member patterns 192R, 192G, 192B, and 192W of the A' region and the common electrode 270, and is subjected to constructive interference. However, light that arrives in the B' region of the transflective member patterns 192R, 192G, 192B, and 192W is emitted outside through the color filters 230R, 230G, 230B, and 230W. Particularly, in the white pixel W, among light that travels between the A' region of the transflective member pattern 192W and the common electrode 270, light that passes through the supplementary transparent members 196Wr and 196Wb has intensities reinforced in the wavelengths corresponding to red and blue similarly to the red and blue pixels R and B, and light that does not pass through the supplementary transparent members 196Wr and 196Wb has an intensity reinforced in the wavelength corresponding to green. Therefore, if areas of the supplementary transparent members 196Wr and 196Wb are appropriately selected, intensities of light that corresponds to the primary colors R, G, and B that are reinforced by constructive interference may be controlled, and thus, white light having high luminance may be emitted.

Various characteristics and effects of the exemplary embodiments that are shown in FIG. 2 and FIG. 10 may be applied to the present exemplary embodiment.

An organic light emitting display device according to another exemplary embodiment of the present invention will be described in detail with reference to FIG. 12 in conjunction with FIG. 1, FIG. 2, and FIG. 3.

Figure 12:
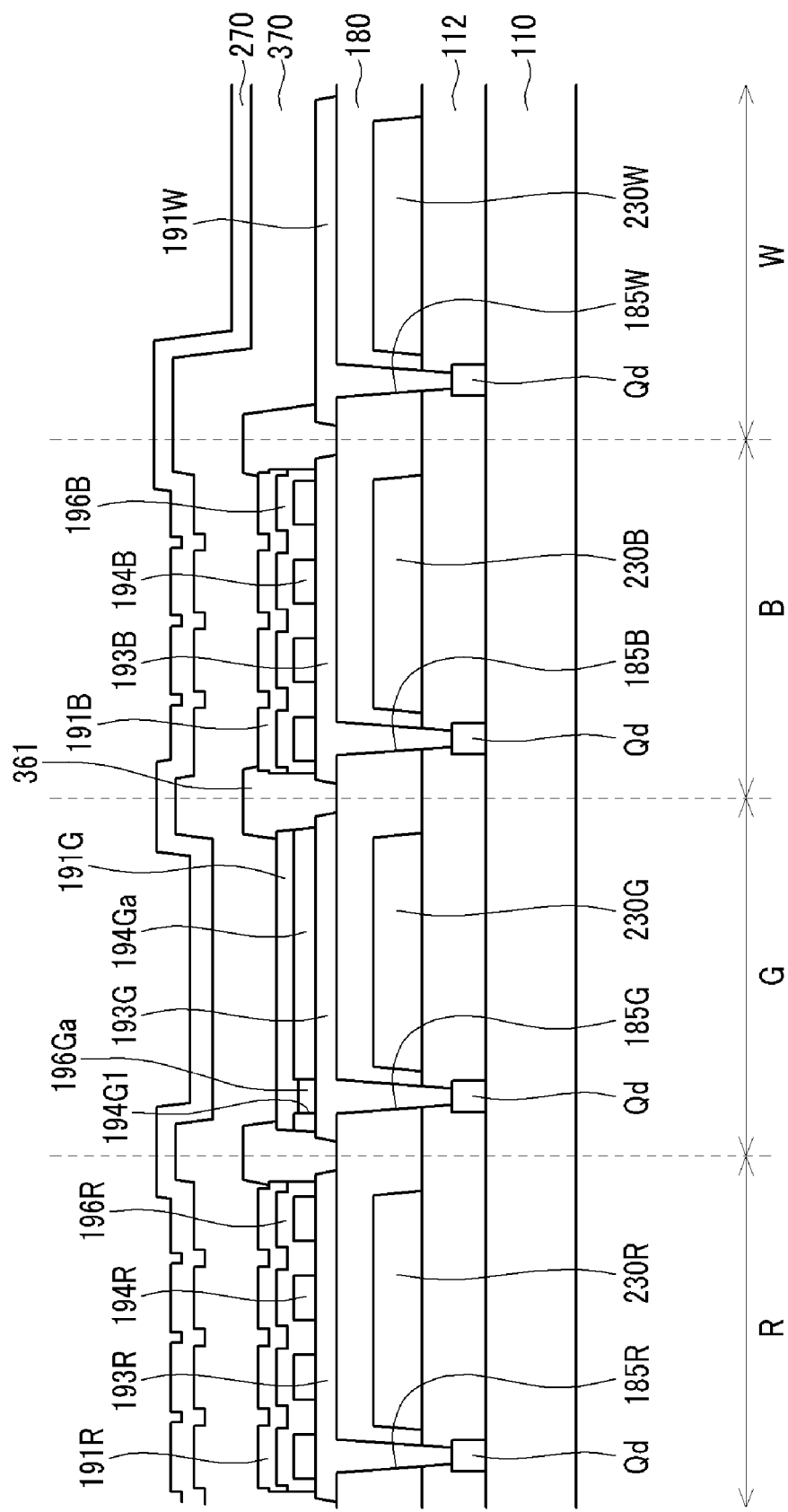

FIG. 12 is a cross-sectional view of an organic light emitting display device according to an exemplary embodiment of the present invention.

The same descriptions as the above exemplary embodiment of FIG. 2 will be omitted and the same constituent elements are provided with the same reference numerals.

On an insulation substrate 110, a thin film transistor array Qd, an insulating layer 112, a plurality of color filters 230R, 230G, 230B, and 230W, an overcoat 180, a plurality of lower transparent members 193R, 193G, and 193B, a plurality of transparent inorganic film patterns 194R, 194Ga, and 194B, a plurality of supplementary transparent members 196R and 196B, a plurality of transparent connecting members 196Ga (corresponding to the green pixel G), a plurality of pixel electrodes 191R, 191G, 191B, and 191W, insulation members 361, a white organic light emitting member 370, and a common electrode 270 are sequentially disposed.

Unlike the exemplary embodiment that is shown in FIG. 2, the transparent inorganic film pattern 194Ga of the green pixel G has a shape that is different from that of the transparent inorganic film patterns 194R and 194B of the red and blue pixels R and B. That is, the transparent inorganic film pattern 194Ga of the green pixel G is continuously formed on an entire surface of the lower transparent member 193G of the green pixel G.

In addition, in the transparent inorganic film pattern 194Ga, a contact hole 194Gl for exposing a portion of the lower transparent member 193G is formed. A transparent connecting member 196Ga is disposed in the contact hole 194Gl, and the pixel electrode 191G is connected to the lower transparent member 193G through the transparent connecting member 196Ga.

In the green pixel G, light that is emitted from the organic light emitting member 370 is reflected at the upper side of the lower transparent member 193G or the upper side of the transparent inorganic film pattern 194Ga toward the common electrode 270, and the common electrode 270 reflects it again. As described above, light that reciprocates between the upper side or the lower side of the transparent inorganic film pattern 194Ga and the common electrode 270 may be subjected to an optical process such as constructive interference, thereby reinforcing light corresponding to a green wavelength.

Unlike the present exemplary embodiment, the structure of the green pixel G and the structures of the red and blue pixels R and B may be exchanged. In the white pixel W, a lower transparent member (not shown), a transparent inorganic film pattern (not shown), and a supplementary transparent member (not shown) may be disposed.

Various characteristics and effects of the exemplary embodiments that are shown in FIG. 2, FIG. 10, and FIG. 11 may be applied to the present exemplary embodiment.

Now, a manufacturing method of the organic light emitting display device that is shown in FIG. 12 will be described in detail with reference to FIG. 13, FIG. 14, FIG. 15, and FIG. 16.

FIG. 13, FIG. 14, FIG. 15, and FIG. 16 are cross-sectional views at intermediate steps of a method for manufacturing an organic light emitting display device shown in FIG. 12 according to an exemplary embodiment of the present invention.

Figure 13:
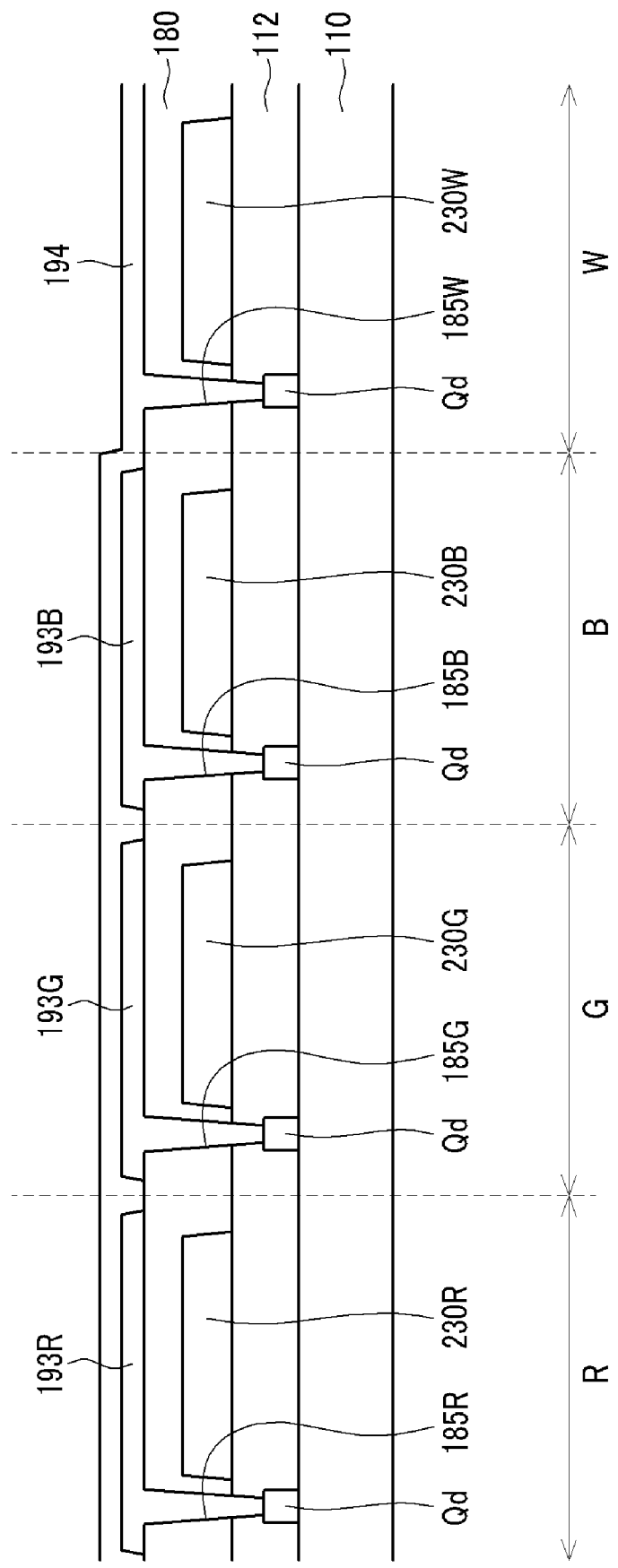
FIG. 13, FIG. 14, FIG. 15, and FIG. 16 are cross-sectional views at intermediate steps of a method for manufacturing an organic light emitting display device shown in FIG. 12 according to an exemplary embodiment of the present invention.

First, with reference to FIG. 13, a thin film transistor array that includes a plurality of driving transistors Qd is formed on the insulation substrate 110, and an insulating layer 112, a plurality of color filters 230R, 230G, 230B, and 230W, and an overcoat 180 are sequentially formed thereon.

Subsequently, by patterning the insulating layer 112 and the overcoat 180, a plurality of contact holes 185R, 185G, 185B, and 185W exposing a portion of the driving transistor Qd are formed, and on the overcoat 180 of the red, green, and blue pixels R, G, and B, lower transparent members 193R, 193G, and 193B are formed. Subsequently, on the overcoat 180 and the lower transparent members 193R, 193G, and 193B of the red, green, and blue pixels R, G, and B, a transparent inorganic material such as silicon nitride or silicon oxide is deposited to form a transparent inorganic film layer 194.

Figure 14:
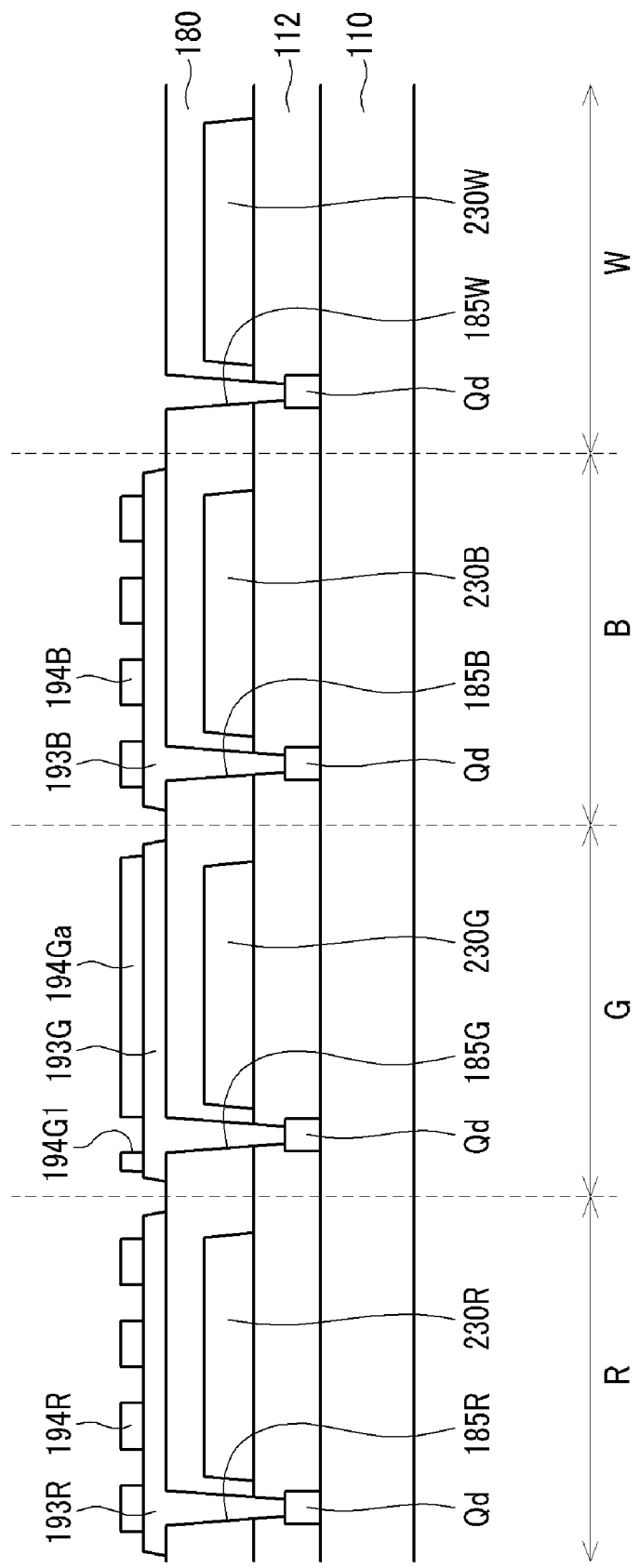

Next, with reference to FIG. 14, transparent inorganic film patterns 194R and 194B are formed, by photolithographic etching of the transparent inorganic film layer 194, in the red and blue pixels R and B, and a transparent inorganic film pattern 194Ga that has a contact hole 194Gl is formed in the green pixel G.

Figure 15:
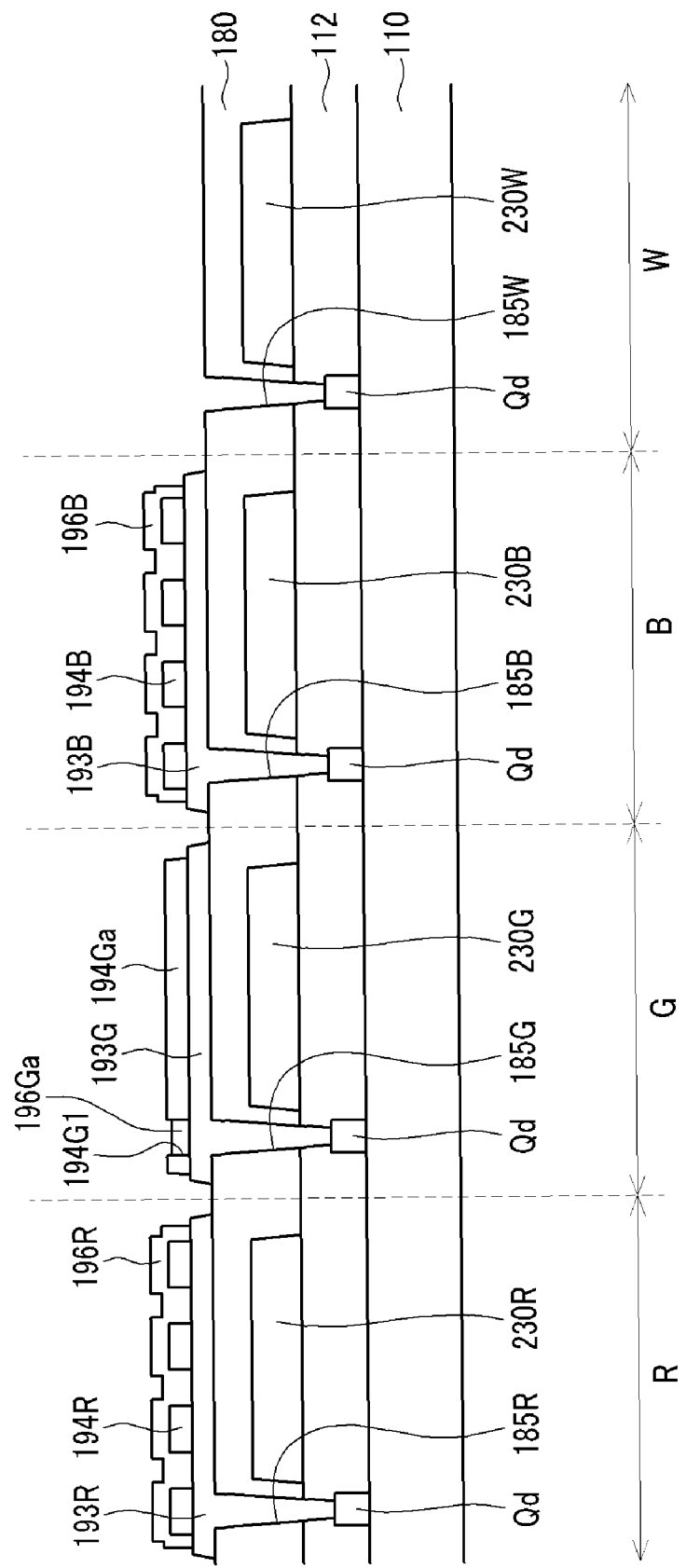

Next, with reference to FIG. 15, after a transparent member layer (not shown) such as ITO or IZO is deposited, photolithography is performed to form a plurality of supplementary transparent members 196R and 196B and a plurality of transparent connecting members 196Ga in the contact hole 194Gl.

Figure 16:
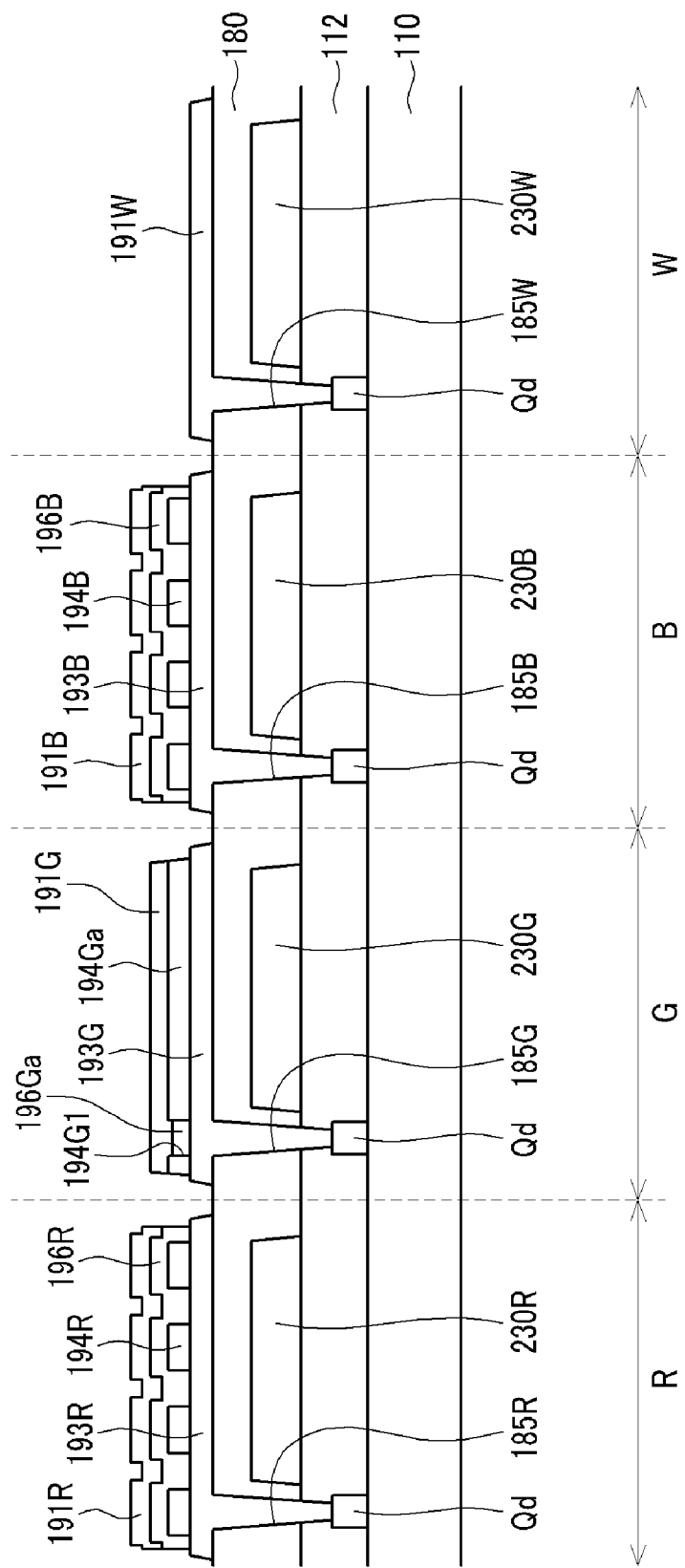

Next, with reference to FIG. 16, a transparent conductive layer (not shown) such as ITO or IZO is deposited on an entire surface of the substrate and subjected to photolithography to form a plurality of pixel electrodes 191R, 191G, 191B, and 191W.

Finally, as shown in FIG. 12, a plurality of insulation members 361, a white organic light emitting member 370, and a common electrode 270 are sequentially formed.

If the above process is performed, as compared to the manufacturing method of the organic light emitting display device according to an exemplary embodiment of the present invention that is shown in FIG. 4, FIG. 5, FIG. 6, FIG. 7, FIG. 8, and FIG. 9, at least one photolithographic process may be omitted, and thus the manufacturing process may be simplified.

Next, an organic light emitting display device according to another exemplary embodiment of the present invention will be described in detail with reference to FIG. 17.

Figure 17:
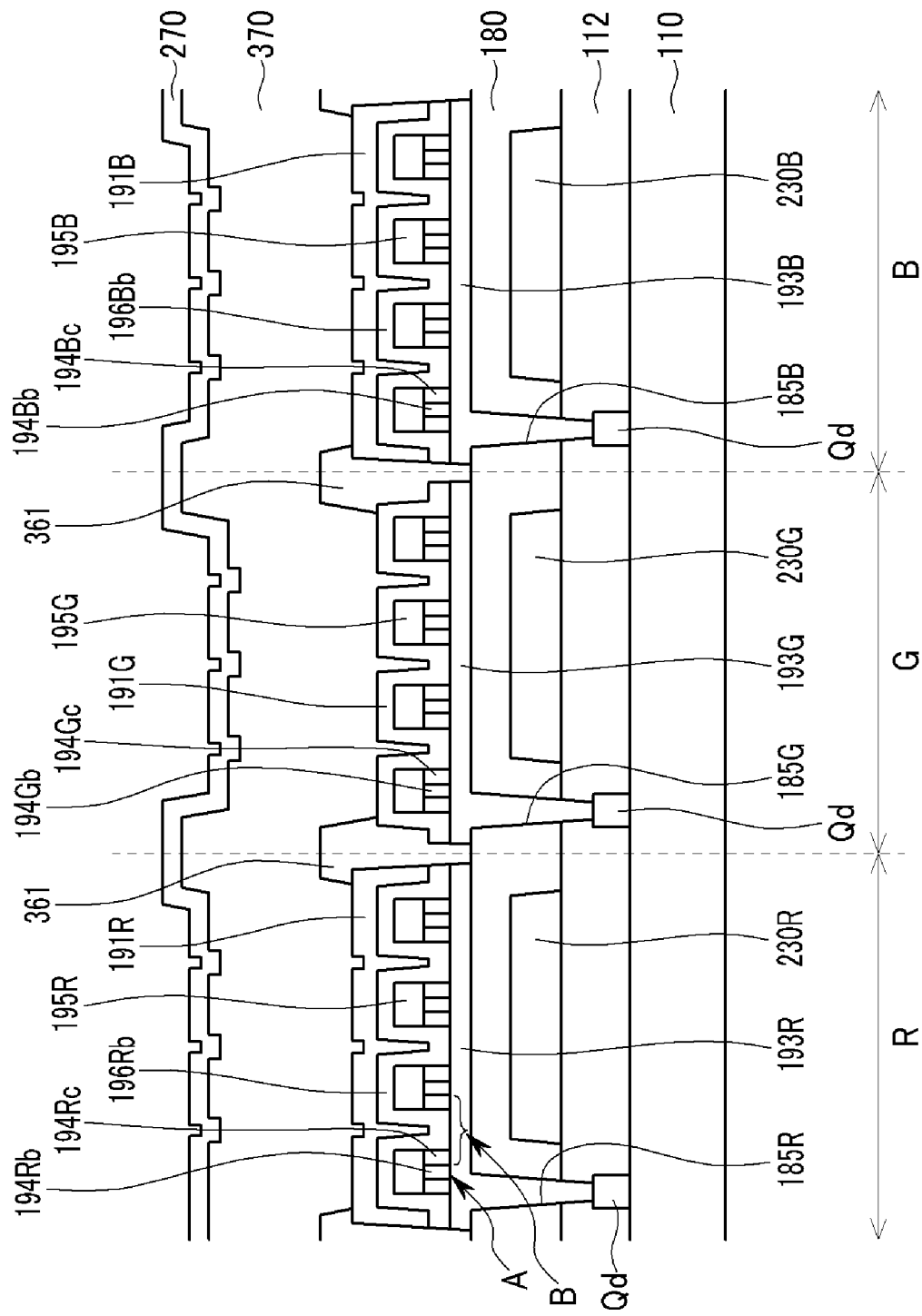
FIG. 17 is a cross-sectional view of an organic light emitting display device according to an exemplary embodiment of the present invention.

FIG. 17 is a cross-sectional view of an organic light emitting display device according to an exemplary embodiment of the present invention.

The same descriptions as the above exemplary embodiment of FIG. 2 will be omitted and the same constituent elements are provided with the same reference numerals.

An organic light emitting display device according to the present exemplary embodiment includes red, green, and blue pixels R, G, and B.

On an insulation substrate 110, a plurality of switching transistors (not shown), a thin film transistor array that includes a plurality of driving transistors Qd, an insulating layer 112, a plurality of color filters 230R, 230G, and 230B, an overcoat 180, and a plurality of lower transparent members 193R, 193G, and 193B that may be made of a transparent conductive material such as ITO or IZO are disposed.

On the insulating layer 112 and the overcoat 180, a plurality of contact holes 185R, 185G, and 185B exposing a portion of the output terminals (not shown) of the driving transistors Qd are disposed. The lower transparent members 193R, 193G, and 193B of the respective pixels R, G, and B are electrically connected to the lower driving transistors Qd through the contact holes 185R, 185G, and 185B.

A plurality of transparent inorganic film patterns 194Rb, 194Gb, and 194Bb that may be made of the transparent inorganic material such as silicon nitride or silicon oxide are disposed on the lower transparent members 193R, 193G, and 193B. Since the shapes of the transparent inorganic film patterns 194Rb, 194Gb, and 194Bb are the same as in the description of the exemplary embodiments of FIG. 2 and FIG. 3, further description thereof will be omitted. However, in the present exemplary embodiment, air layers 194Rc, 194Gc, and 194Bc are present along an outer edge of the A region where the transparent inorganic film is present.

On the transparent inorganic film patterns 194Rb, 194Gb, and 194Bb and the air layers 194Rc, 194Gc, and 194Bc, a plurality of upper transparent patterns 195R, 195G, and 195B that may be made of a transparent conductive material such as ITO or IZO are disposed. The upper transparent patterns 195R, 195G, and 195B are present only on the transparent inorganic film patterns 194Rb, 194Gb, and 194Bb and the air layers 194Rc, 194Gc, and 194Bc, and the planar shape thereof is substantially the same as the shapes of the planar shape of the transparent inorganic film patterns 194Rb, 194Gb, and 194Bb and the air layers 194Rc, 194Gc, and 194Bc.

A plurality of supplementary transparent members 196Rb and 196Bb are disposed on the upper transparent patterns 195R and 195B and the lower transparent members 193R and 193B of the red and blue pixels R and B. A plurality of pixel electrodes 191G are disposed on the upper transparent pattern 195G and lower transparent member 193G of the green pixel G. The supplementary transparent members 196Rb and 196Bb and pixel electrode 191G may be made of a transparent conductive material such as ITO or IZO, and the thicknesses of the supplementary transparent members 196Rb and 196Bb may be substantially the same.

A plurality of pixel electrodes 191R and 191B that may be made of a transparent conductive material such as ITO or IZO are disposed on the supplementary transparent members 196Rb and 196Bb of the red and blue pixels R and B.

A plurality of insulation members 361 are disposed between adjacent pixel electrodes 191R, 191G, and 191B, and a white organic light emitting member 370 and a common electrode 270 are sequentially disposed on the insulation members 361 and the pixel electrodes 191R, 191G, and 191B.

In the present exemplary embodiment, light that is emitted from the organic light emitting member 370 is reflected at the upper side of the A region where the transparent inorganic film of the transparent inorganic film patterns 194Rb, 194Gb, and 194Bb is present or at the upper sides of the air layers 194Rc, 194Gc, and 194Bc toward the common electrode 270. Since a difference between the refractive indexes of the air layers 194Rc, 194Gc, and 194Bc, which is 1, and the upper transparent patterns 195R, 195G, and 195B is larger than a difference between the refractive indexes of the transparent inorganic film patterns 194Rb, 194Gb, and 194Bb and the upper transparent patterns 195R, 195G, and 195B, stronger reflection occurs at the upper sides of the air layers 194Rc, 194Gc, and 194Bc. Accordingly, color purity and luminance of each color R, G, and B may be increased.

In addition, reflection of incident light may occur at the lower side of the A region in which the transparent inorganic film of the transparent inorganic film patterns 194Rb, 194Gb, and 194Bb is present or at the lower sides of the air layers 194Rc, 194Gc, and 194Bc, and at this time, the thicknesses of the transparent inorganic film patterns 194Rb, 194Gb, and 194Bb may be integer multiples of ¼ of the wavelengths corresponding to each color R, G, and B. Similarly, reflection of incident light may occur at the boundary between the lower transparent members 193R, 193G, and 193B and the overcoat 180 that have different refractive indexes from each other, and in this case, the thicknesses of the lower transparent members 193R, 193G, and 193B may be integer multiples of ¼ of the wavelengths corresponding to each color R, G, and B.

Unlike the present exemplary embodiment, the lower transparent members 193R, 193G, and 193B or the upper transparent patterns 195R, 195G, and 195B may be made of silicon oxide or silicon nitride. In this case, the transparent inorganic film patterns 194Rb, 194Gb, and 194Bb may be made of a transparent inorganic material that is different from that of the lower transparent members 193R, 193G, and 193B and the upper transparent patterns 195R, 195G, and 195B. At this time, the pixel electrodes 191R, 191G, and 191B or the supplementary transparent members 196Rb and 196Bb may be directly connected to the driving transistors Qd through contact holes (not shown).

Various characteristics and effects of the organic light emitting display device of FIG. 2 as described above may be applied to the present exemplary embodiment.

Now, a manufacturing method of the organic light emitting display device that is shown in FIG. 17 will be described in detail with reference to FIG. 18, FIG. 19, FIG. 20, FIG. 21, and FIG. 22.

FIG. 18, FIG. 19, FIG. 20, FIG. 21, and FIG. 22 are cross-sectional views of intermediate steps of a method for manufacturing an organic light emitting display device shown in FIG. 17 according to an exemplary embodiment of the present invention.

Figure 18:
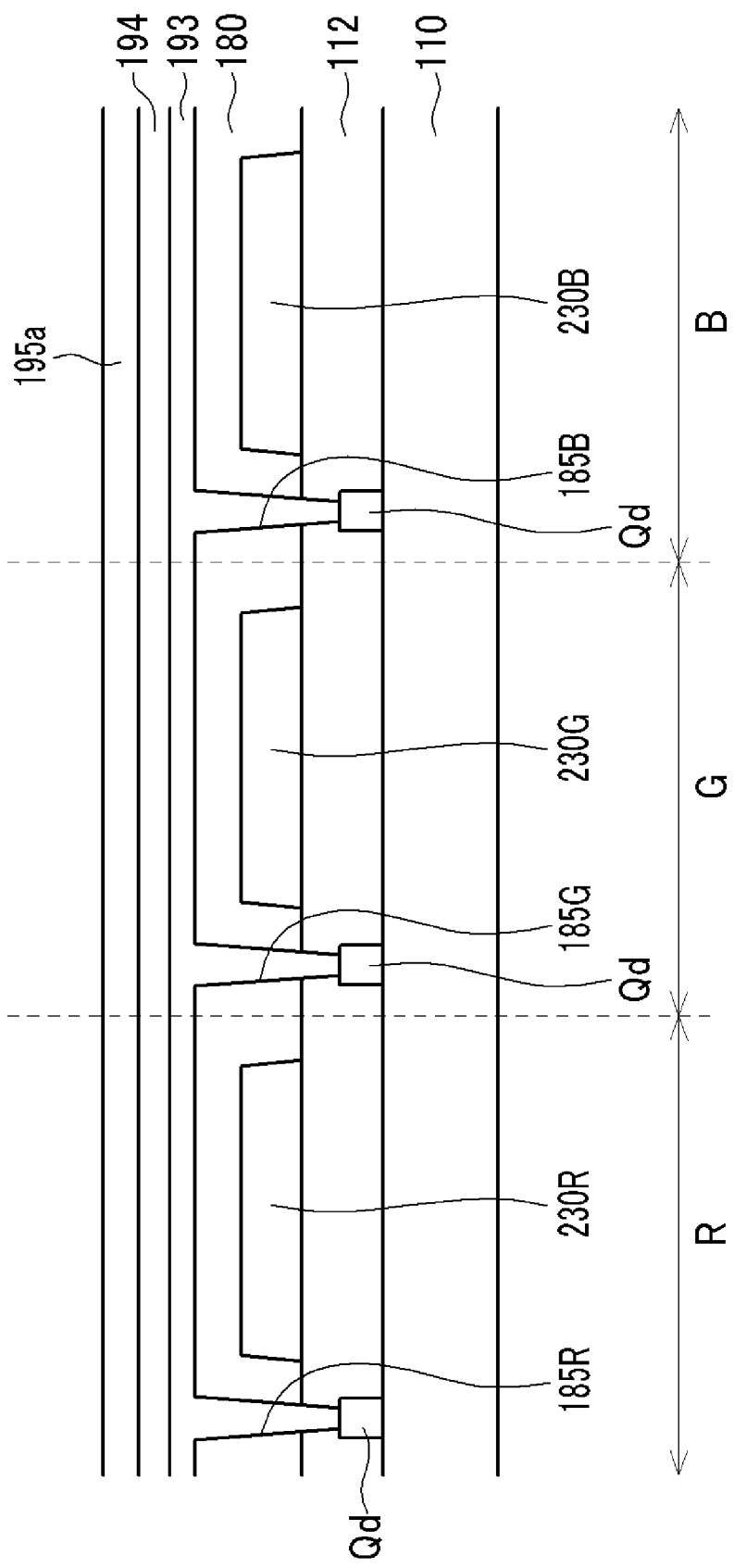
FIG. 18, FIG. 19, FIG. 20, FIG. 21, and FIG. 22 are cross-sectional views at intermediate steps of a method for manufacturing an organic light emitting display device shown in FIG. 17 according to an exemplary embodiment of the present invention.

First, with reference to FIG. 18, a thin film transistor array that includes a plurality of driving transistors Qd is formed on an insulation substrate 110. Then, an insulating layer 112, a plurality of color filters 230R, 230G, and 230B, and an overcoat 180 are sequentially formed thereon.

Subsequently, by patterning the insulating layer 112 and the overcoat 180, a plurality of contact holes 185R, 185G, and 185B exposing a portion of the driving transistor Qd are formed.

Subsequently, a lower transparent member layer 193 that may be made of a transparent conductive material such as ITO or IZO or a transparent inorganic material such as silicon nitride or silicon oxide, a transparent inorganic film layer 194 that may be made of an inorganic material different from the lower transparent member layer 193, and an upper transparent member layer 195a that may be made of a transparent conductive material such as ITO or IZO or a transparent inorganic material such as silicon nitride or silicon oxide are sequentially deposited on the overcoat 180.

Figure 19:
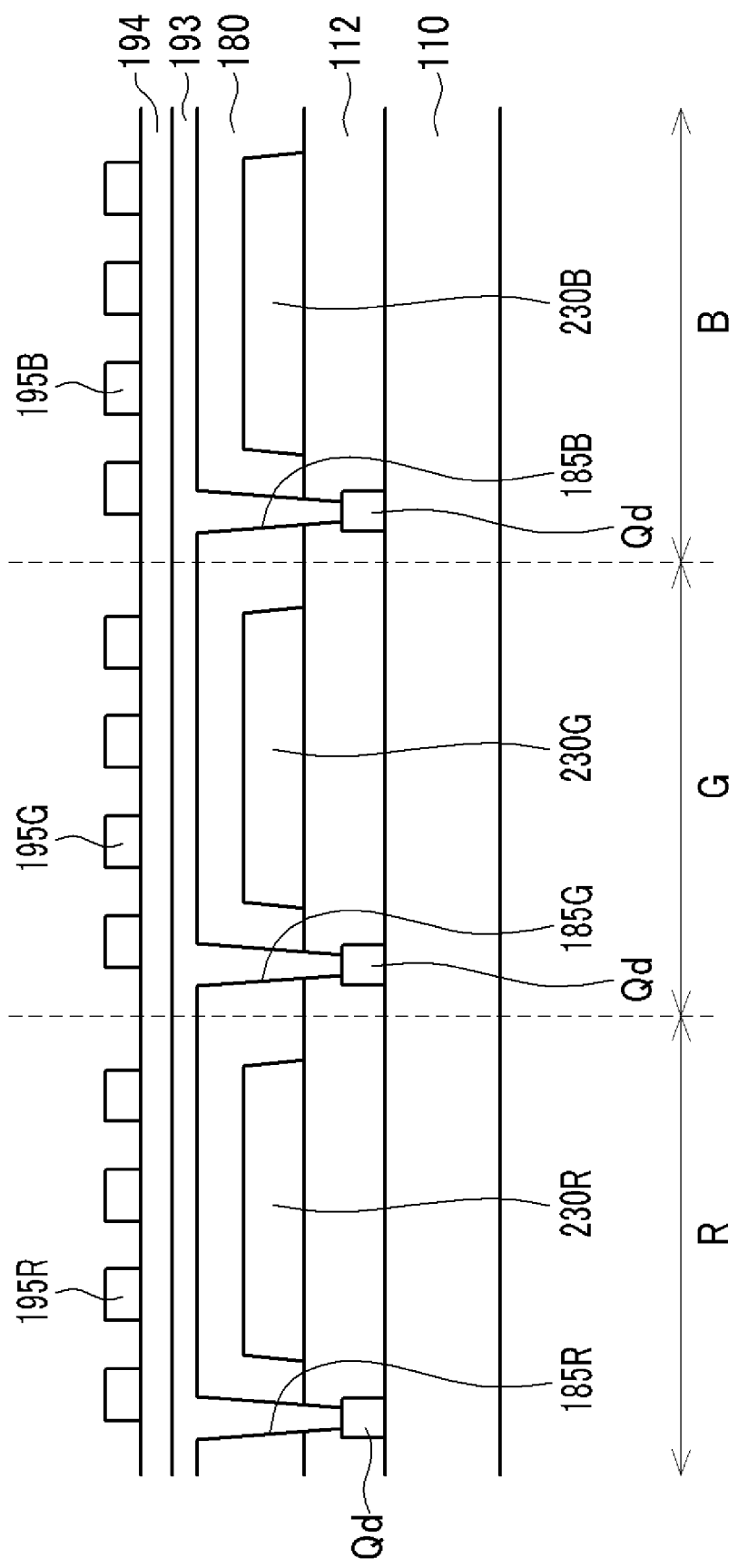

Next, with reference to FIG. 19, the upper transparent member layer 195a is subjected to photolithography to form a plurality of upper transparent patterns 195R, 195G, and 195B.

Figure 20:
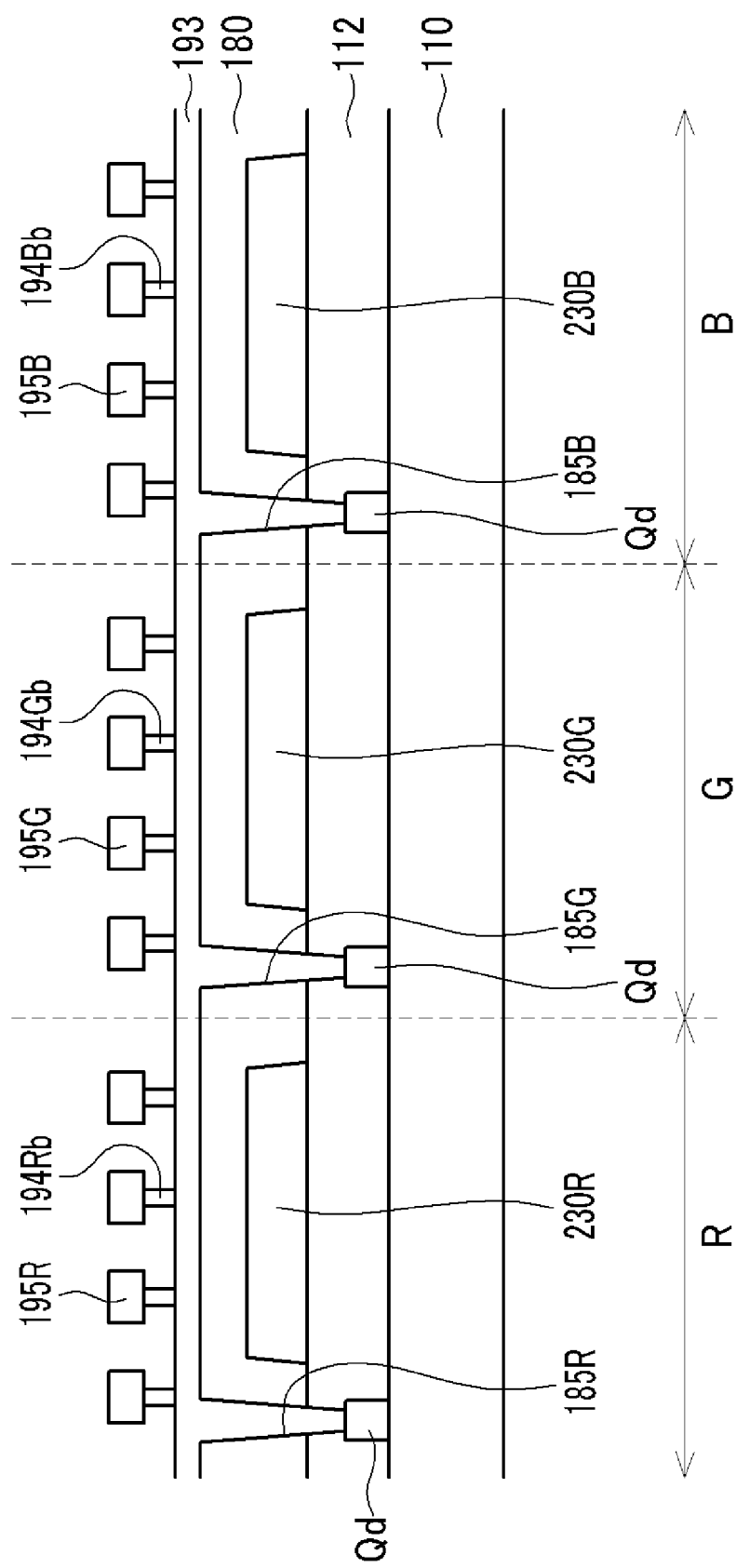

Next, with reference to FIG. 20, by over-etching the transparent inorganic film layer 194 using the upper transparent patterns 195R, 195G, and 195B as an etching mask, transparent inorganic film patterns 194Rb, 194Gb, and 194Bb that have smaller areas than the upper transparent patterns 195R, 195G, and 195B and have an undercut structure are formed. At this time, dry etching may be used, and an etching solution or an etching gas that has a large etching ratio with respect to the upper transparent patterns 195R, 195G, and 195B and the transparent inorganic film layer 194 may be used.

Figure 21:
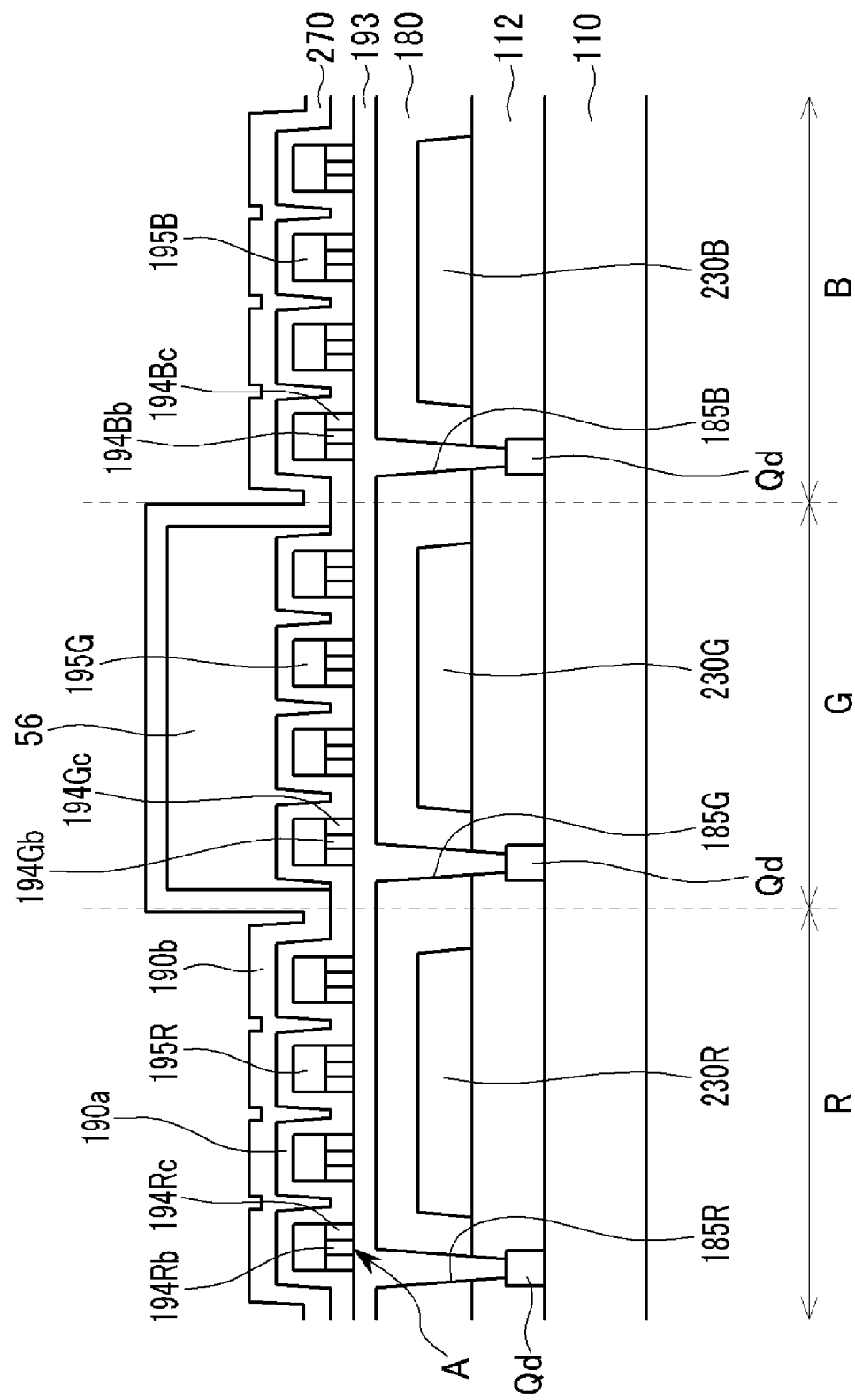

Next, with reference to FIG. 21, a lower transparent conductive layer 190a such as ITO or IZO is deposited on the entire surface thereof. Thereby, air layers 194Rc, 194Gc, and 194Bc are formed around each region A in which the transparent inorganic film of the transparent inorganic film patterns 194Rb, 194Gb, and 194Bb is present. Subsequently, a photosensitive film is coated, exposed to light, and developed to form a photosensitive film pattern 56 that covers the lower transparent conductive layer 190a of the green pixel G.

Next, the upper transparent conductive layer 190b such as ITO or IZO is deposited on the entire surface thereof.

Figure 22:
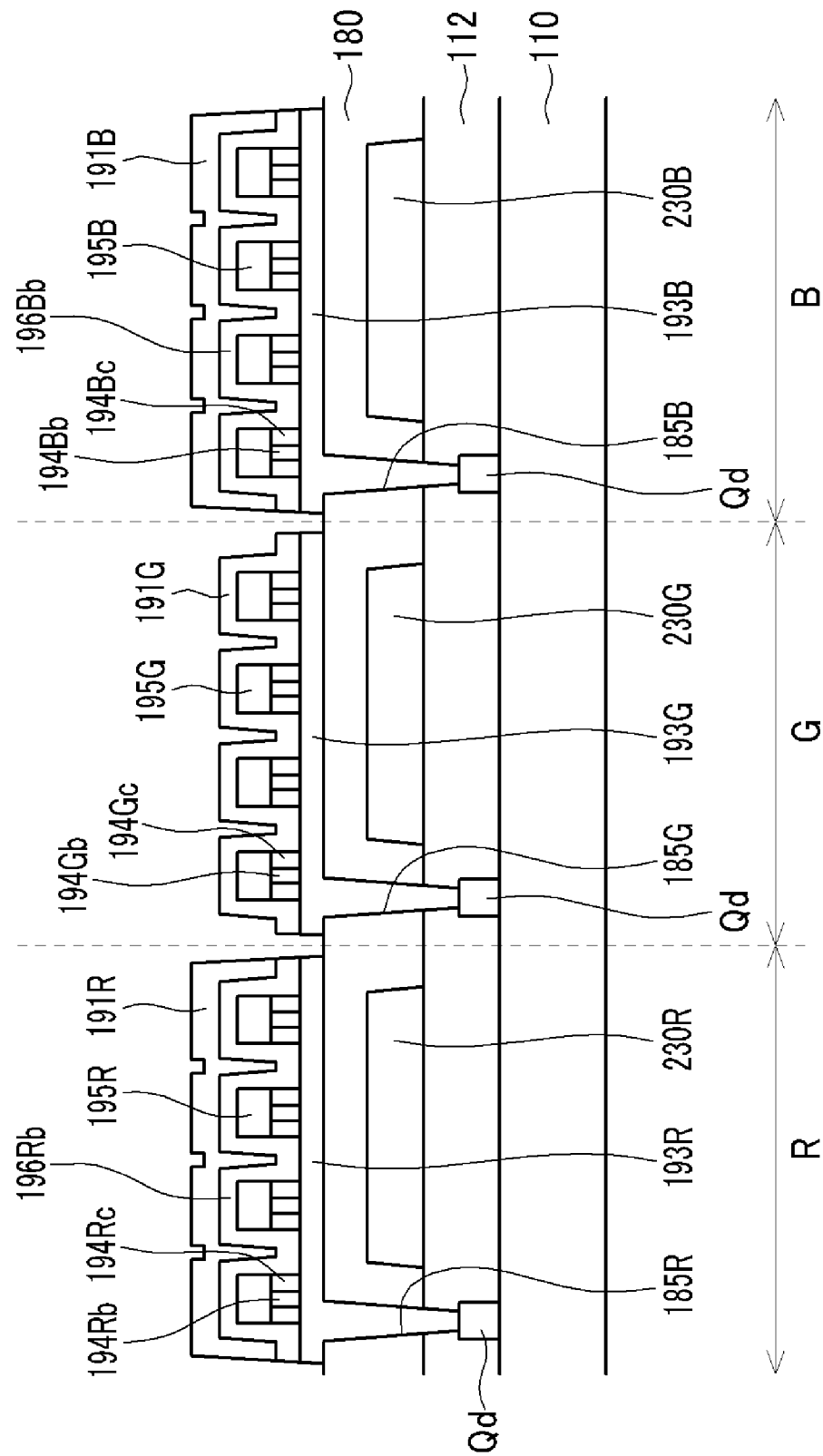

Then, with reference to FIG. 22, the upper transparent conductive layer 190b, the lower transparent conductive layer 190a and the lower transparent member layer 193 are subjected to photolithography to form a plurality of lower transparent members 193R, 193G, and 193B, supplementary transparent members 196Rb and 196Bb of the red and blue pixels R and B, and pixel electrodes 191R, 191G, and 191B at the same time. Subsequently, the photosensitive film pattern 56 is removed.

Finally, as shown in FIG. 17, a plurality of insulation members 361, a white organic light emitting member 370, and a common electrode 270 are sequentially formed.

Now, an organic light emitting display device according to another exemplary embodiment of the present invention will be described in detail with reference to FIG. 23.

Figure 23:
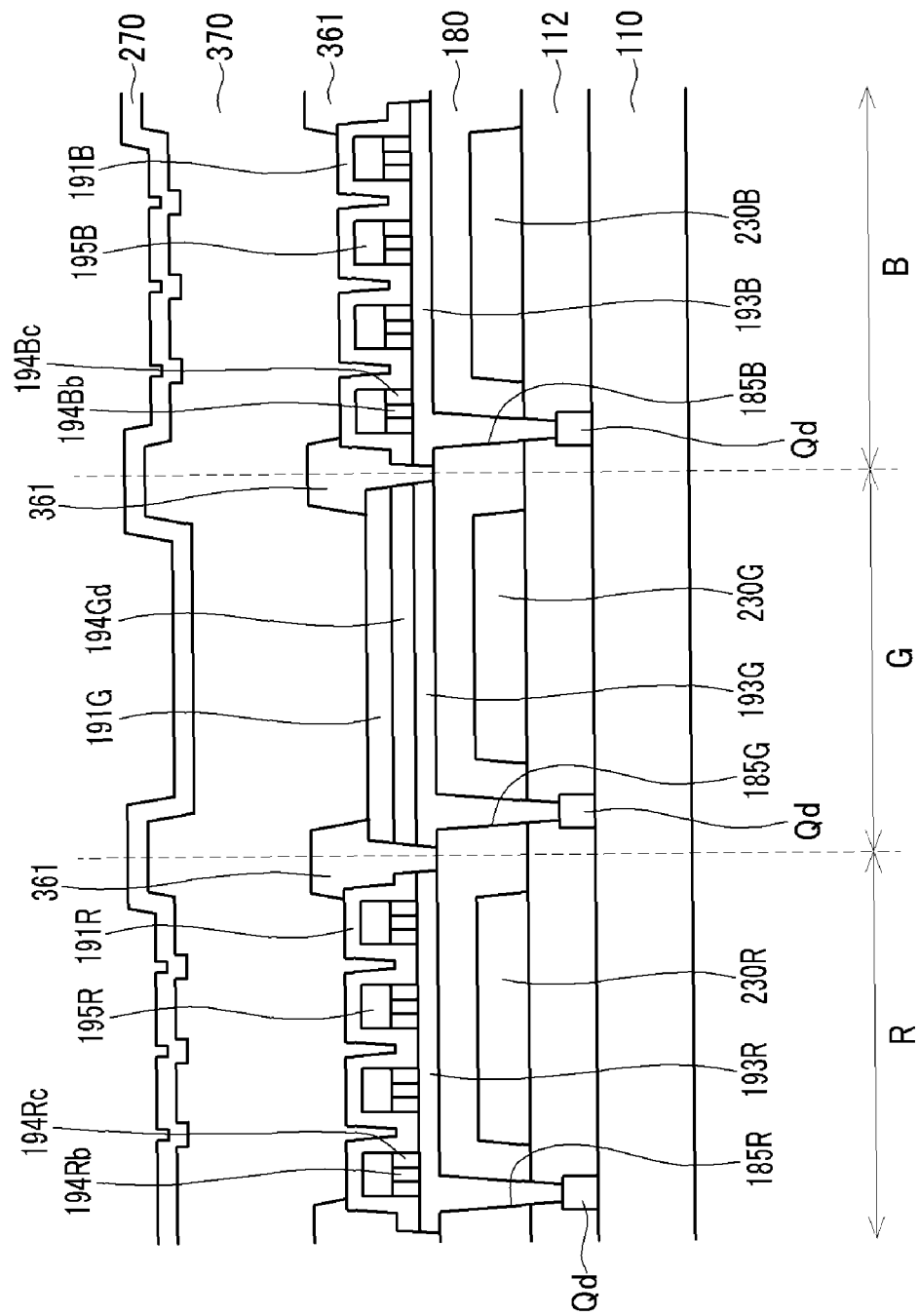
FIG. 23 is a cross-sectional view of an organic light emitting display device according to an exemplary embodiment of the present invention.

FIG. 23 is a cross-sectional view of an organic light emitting display device according to an exemplary embodiment of the present invention.

The same descriptions as the above exemplary embodiment that is shown in FIG. 17 will be omitted and the same constituent elements are provided with the same reference numerals.

On an insulation substrate 110, a thin film transistor array that includes a plurality of switching transistors (not shown) and a plurality of driving transistors Qd, an insulating layer 112, a plurality of color filters 230R, 230G, and 230B, an overcoat 180, a plurality of lower transparent members 193R, 193G, and 193B, a plurality of transparent inorganic film patterns 194Rb, 194Gd, and 194Bb, and a plurality of air layers 194Rc and 194Bc (except for the green pixel G), a plurality of upper transparent patterns 195R and 195B (except for the green pixel G), a plurality of pixel electrodes 191R, 191G, and 191B, insulation members 361, a white organic light emitting member 370, and a common electrode 270 are sequentially disposed.

In the present exemplary embodiment, the structure of the green pixel G is different from the structures of the red and blue pixels R and B. That is, in the green pixel G, no upper transparent pattern is present, but transparent inorganic film pattern 194Gd of the green pixel G is formed on an entire surface of the lower transparent member 193G of the green pixel G, and the shape of the transparent inorganic film pattern 194Gd is different from the shape of the transparent inorganic film patterns 194Rb and 194Bb of the red and blue pixels R and B. Accordingly, in the green pixel G, no air layer is present around the transparent inorganic film pattern 194Gd, and the light reflection ratio at the upper surface or the lower surface of the transparent inorganic film pattern 194Gd is lower than the red and blue pixels R and B.

In the present exemplary embodiment, by appropriately selecting the optical path length between the transparent inorganic film pattern 194Gd of the green pixel G and the common electrode 270, light of the wavelength corresponding to green may be intensified. Also, by appropriately controlling the thicknesses of the upper transparent patterns 195R and 195B that are present only in the red and blue pixels R and B, light of the wavelengths corresponding to red and blue may be intensified.

Various characteristics and effects of the organic light emitting display device of FIG. 17 as described above may be applied to the present exemplary embodiment.

Now, with reference to FIG. 24, FIG. 25, FIG. 26, and FIG. 27, a manufacturing method of the organic light emitting display device that is shown in FIG. 23 will be described in detail.

FIG. 24, FIG. 25, FIG. 26, and FIG. 27 are cross-sectional views at intermediate steps of a method for manufacturing an organic light emitting display device shown in FIG. 23 according to an exemplary embodiment of the present invention.

Figure 24:
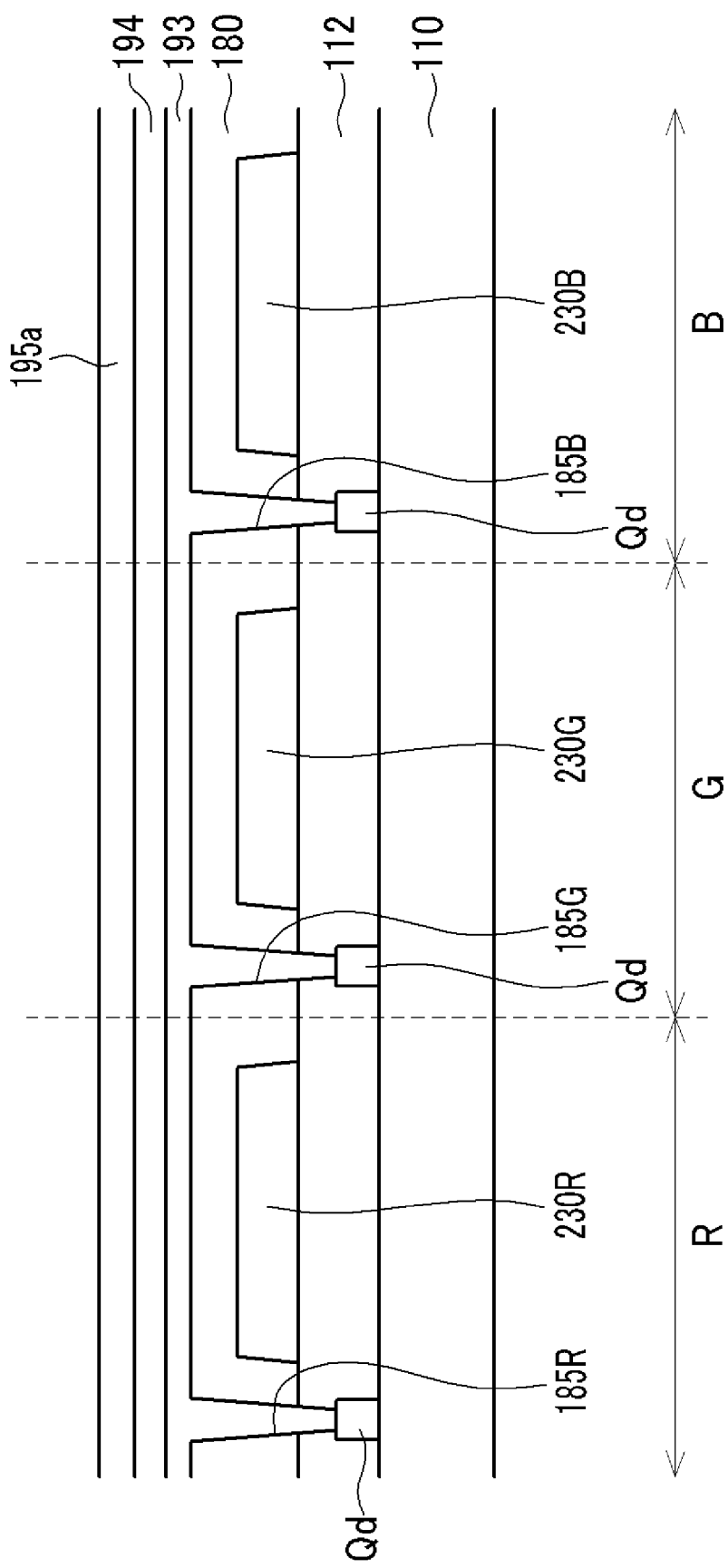

First, with reference to FIG. 24, a thin film transistor array that includes a plurality of driving transistors Qd is formed on an insulation substrate 110, and an insulating layer 112, a plurality of color filters 230R, 230G, and 230B and an overcoat 180 are sequentially formed thereon.

Subsequently, by patterning the insulating layer 112 and the overcoat 180, a plurality of contact holes 185R, 185G, and 185B exposing a portion of the driving transistor Qd are formed.

Subsequently, a lower transparent member layer 193 that is made of a transparent conductive material such as ITO or IZO or a transparent inorganic material such as silicon nitride or silicon oxide, a transparent inorganic film layer 194 that is made of an inorganic material that is different from the lower transparent member layer 193, and an upper transparent member layer 195a that is made of a transparent conductive material such as ITO or IZO or a transparent inorganic material such as silicon nitride or silicon oxide are sequentially deposited on the overcoat 180.

Figure 25:
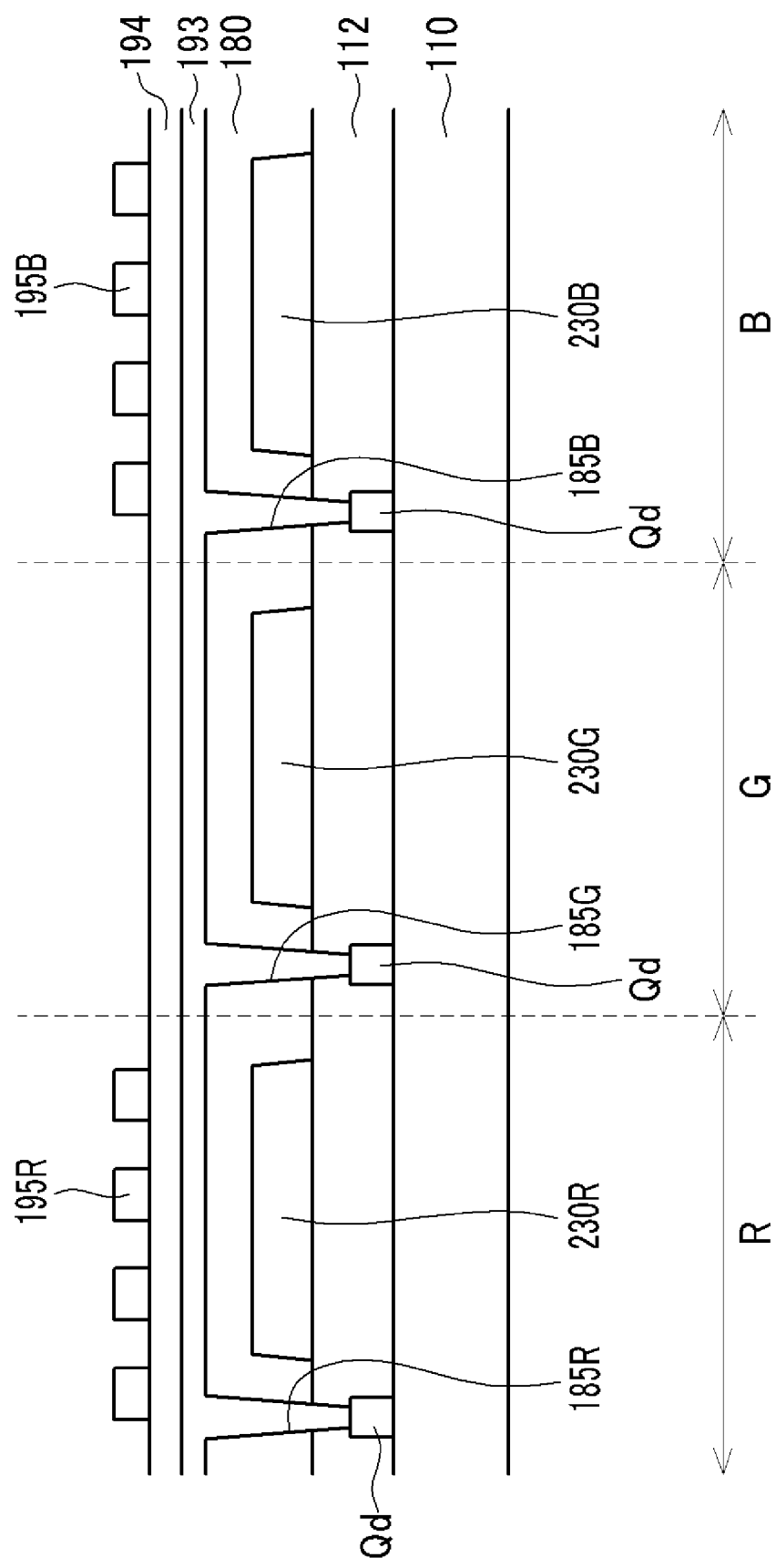

Next, with reference to FIG. 25, the upper transparent member layer 195a is subjected to photolithography and a plurality of upper transparent patterns 195R and 195B that are positioned on the red and blue pixels R and B are formed. At this time, the upper transparent member layer 195a of the green pixel G is removed.

Figure 26:
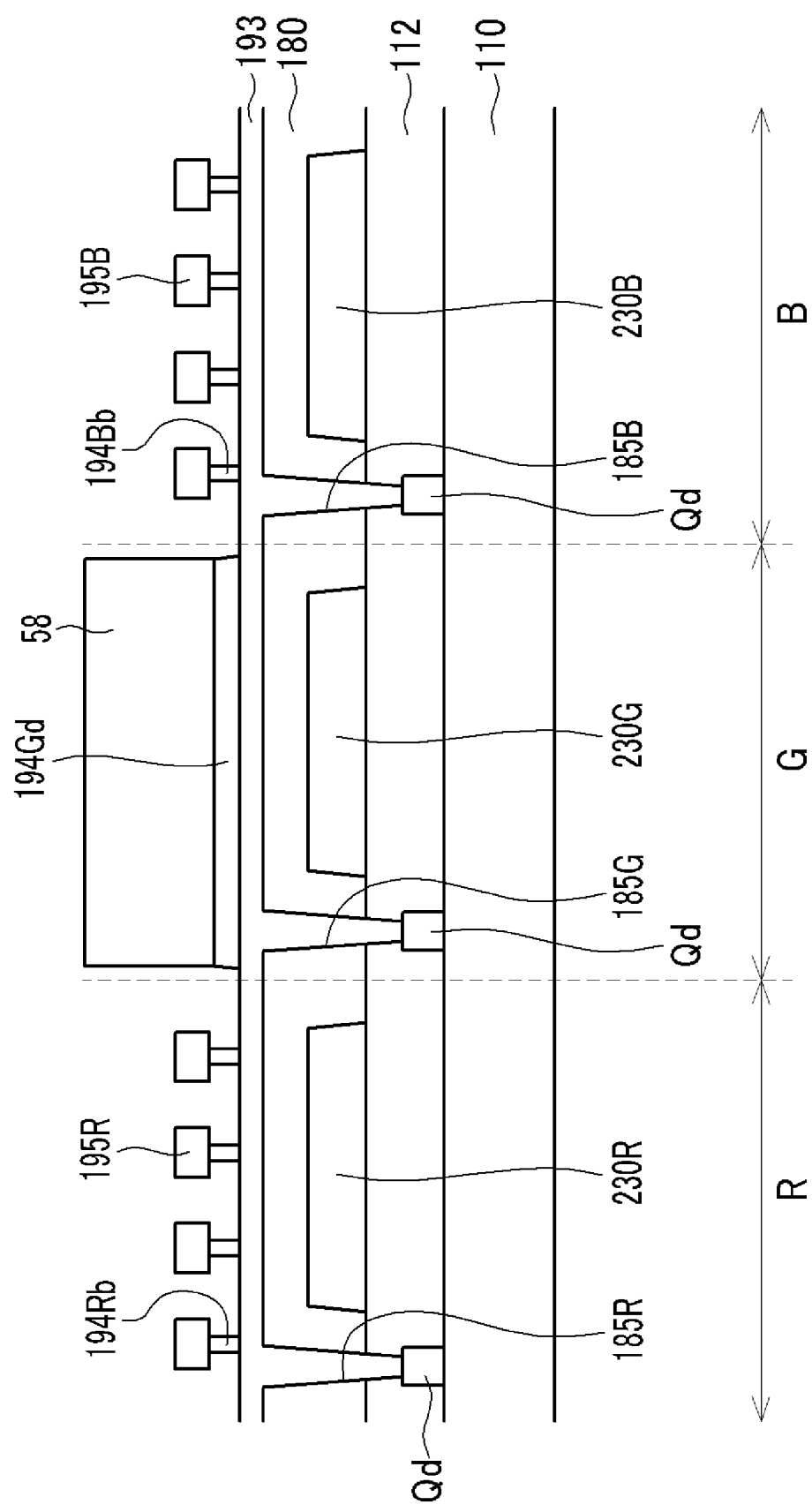

Next, with reference to FIG. 26, after a photosensitive film pattern 58 that covers the transparent inorganic film layer 194 of the green pixel G is formed, the transparent inorganic film layers 194 of the red and blue pixels R and B are over-etched to form transparent inorganic film patterns 194Rb and 194Bb that have a smaller area than the upper transparent patterns 195R and 195B and have an undercut structure. At this time, the transparent inorganic film layer 194 of the green pixel G is protected by the photosensitive film pattern 58.

Next, with reference to FIG. 27, the photosensitive film pattern 58 is removed, and a transparent conductive layer (not shown) such as ITO or IZO is deposited. Subsequently, the transparent conductive layer (not shown) and the lower transparent member layer 193 are subjected to photolithography to form a plurality of pixel electrodes 191R, 191G, and 191B and a plurality of lower transparent members 193R, 193G, and 193B. At this time, air layers 194Rc and 194Bc are formed around each region in which the transparent inorganic film of the transparent inorganic film patterns 194Rb and 194Bb of the red and blue pixels R and B is present.

Finally, as shown in FIG. 23, a plurality of insulation members 361, a white organic light emitting member 370, and a common electrode 270 are sequentially formed.

In this way, the manufacturing process of the organic light emitting display device may be simplified.

According to exemplary embodiments of the present invention as described above, by patterning a layer that may be made of an inorganic film or a transflective member that allows light to be resonant together with a common electrode 270 to reinforce light of the wavelengths corresponding to primary colors, characteristics according to viewing angles may be improved. In addition, by forming an air layer in the patterned layer, reflection characteristics may be improved, and color reproducibility of an organic light emitting member may be improved. The present invention may be applied to organic light emitting display devices that emit light upward and various other organic light emitting display devices having various structures.

As described above, according to the exemplary embodiment of the present invention, a change in spectrum and luminance according to viewing angles and color variation may be reduced. In addition, light efficiency of an organic light emitting display device may be increased and resistance of an organic light emitting element may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   a substrate;
   a plurality of thin film transistors disposed on the substrate;
   an overcoat disposed on the thin film transistors;
   a lower transparent member disposed on the overcoat;
   a thin film pattern disposed on the lower transparent member, the thin film pattern comprising a plurality of first portions where a thin film is present and a plurality of second portions where the thin film is not present;
   a first electrode disposed on the thin film pattern;
   an air layer disposed between the first electrode and the lower transparent member, the air layer being in the same layer as the thin film pattern;
   an organic light emitting member disposed on the first electrode; and
   a second electrode disposed on the organic light emitting member,
   wherein the first portion and the second portion are alternately arranged.

2. The organic light emitting display device of claim 1, wherein
   the thin film pattern comprises a transparent inorganic material.

3. The organic light emitting display device of claim 1, wherein
   a refractive index of the thin film pattern is different from a refractive index of the first electrode.

4. The organic light emitting display device of claim 1, wherein
   a refractive index of the thin film pattern is different from a refractive index of the lower transparent member.

5. The organic light emitting display device of claim 1, wherein the air layer is disposed along an edge of the first portion of the thin film pattern.

6. The organic light emitting display device of claim 1, wherein
a shape of at least one of the first portion or the second portion comprises a polygon, a circle, and an oval.

7. The organic light emitting display device of claim 1, wherein
the thin film pattern comprises a transflective metal member, the transflective metal member comprising silver (Ag) or aluminum (Al).

8. The organic light emitting display device of claim 5, further comprising
an upper transparent pattern that comprises an upper transparent layer, the upper transparent layer disposed only on the first portion of the thin film pattern and the air layer.

9. The organic light emitting display device of claim 8, wherein
at least one of the first electrode, the upper transparent pattern, and the lower transparent member comprises a transparent conductive material, and the thin film pattern comprises a transparent inorganic material.

10. The organic light emitting display device of claim 8, wherein at least one of the first electrode, the upper transparent pattern, and the lower transparent member comprises at least one of ITO, IZO, and silicon nitride, and the thin film pattern comprises silicon oxide.

11. The organic light emitting display device of claim 9, wherein
at least one of the first electrode, the upper transparent pattern, and the lower transparent member comprises Indium Tin Oxide (ITO) or Indium Zinc Oxide (IZO), and the thin film pattern comprises silicon oxide or silicon nitride.

12. The organic light emitting display device of claim 7, wherein
the thin film pattern further comprises an oxide conductive member disposed on or below the transflective metal member.

13. The organic light emitting display device of claim 12, wherein
the oxide conductive member comprises ITO or IZO.

14. An organic light emitting display device, comprising:
a first pixel to display a first color;
a second pixel to display a second color; and
a third pixel to display a third color,
wherein each of the first pixel, the second pixel, and the third pixel comprises:
a thin film transistor;
a lower transparent member disposed on the thin film transistor;
a transparent pattern disposed on the lower transparent member;
a first electrode disposed on the transparent pattern, the first electrode being connected to the thin film transistor;
an organic light emitting member disposed on the first electrode; and
a second electrode disposed on the organic light emitting member,
wherein a supplementary transparent member is disposed on the transparent pattern of at least one of the first pixel, the second pixel, and the third pixel, wherein the first pixel transparent pattern comprises a first portion where a transparent film is present and a second portion where the transparent film is not present, and the first portion and the second portion are alternately arranged, and
wherein the supplementary transparent member comprises a continuous layer that directly contacts the lower transparent member and the first electrode.

15. The organic light emitting display device of claim 14, wherein
a refractive index of the transparent pattern is different from a refractive index of the first electrode.

16. The organic light emitting display device of claim 14, further comprising
an air layer disposed between the first electrode and the lower transparent member of the first pixel.

17. The organic light emitting display device of claim 14, wherein the supplementary transparent member is disposed on the transparent pattern of the first pixel and the second pixel, and is not disposed on the third pixel.

18. The organic light emitting display device of claim 14, wherein
the supplementary transparent member comprises at least one of ITO, IZO, silicon oxide, and silicon nitride.

19. The organic light emitting display device of claim 14, wherein
the supplementary transparent member is disposed in the first pixel.

20. The organic light emitting display device of claim 14, wherein
the third pixel transparent pattern comprises a continuous transparent film, and the transparent pattern comprises a contact hole exposing the lower transparent member.

21. The organic light emitting display device of claim 16, wherein
the air layer is disposed along an edge of the first portion of the transparent pattern.

22. The organic light emitting display device of claim 21, further comprising
an upper transparent pattern that comprises an upper transparent layer, the upper transparent layer being disposed only on the first portion of the transparent pattern and the air layer.

23. The organic light emitting display device of claim 22, wherein
at least one of the first electrode, the upper transparent pattern, and the lower transparent member comprises ITO or IZO, and the transparent pattern comprises silicon oxide or silicon nitride.

24. The organic light emitting display device of claim 22, wherein
at least one of the first electrode, the upper transparent pattern, and the lower transparent member comprises at least one of ITO, IZO, and silicon nitride, and the transparent pattern comprises silicon oxide.

25. The organic light emitting display device of claim 20, wherein
the first pixel displays red, the second pixel displays blue, and the third pixel displays green.

* * * * *